(12) United States Patent
Aono et al.

(10) Patent No.: US 8,022,433 B2
(45) Date of Patent: Sep. 20, 2011

(54) SEMICONDUCTOR SENSOR DEVICE AND METHOD FOR MANUFACTURING SAME

(75) Inventors: Takanori Aono, Mohka (JP); Ryoji Okada, Kasumigaura (JP); Atsushi Kazama, Mohka (JP); Yoshiaki Takada, Mohka (JP)

(73) Assignee: Hitachi Metals, Ltd., Tokyo (JP)

( * ) Notice: Subject to any disclaimer, the term of this patent is extended or adjusted under 35 U.S.C. 154(b) by 451 days.

(21) Appl. No.: 12/282,986

(22) PCT Filed: Aug. 27, 2007

(86) PCT No.: PCT/JP2007/066552
§ 371 (c)(1),
(2), (4) Date: Sep. 15, 2008

(87) PCT Pub. No.: WO2008/029654
PCT Pub. Date: Mar. 13, 2008

(65) Prior Publication Data
US 2009/0050990 A1      Feb. 26, 2009

(30) Foreign Application Priority Data

Sep. 6, 2006    (JP) .................................. 2006-241089
Nov. 27, 2006   (JP) .................................. 2006-317972
Jan. 22, 2007   (JP) .................................. 2007-011473

(51) Int. Cl.
*H01L 33/00*    (2010.01)
*H01L 29/84*    (2006.01)
*H01L 21/00*    (2006.01)

(52) U.S. Cl. .................. 257/99; 257/415; 257/E21.505; 257/E29.324; 438/51

(58) Field of Classification Search .......................... None
See application file for complete search history.

(56) References Cited

U.S. PATENT DOCUMENTS

| 6,750,479 B2 * | 6/2004 | Haag ............................. 257/99 |
| 2003/0113982 A1 | 6/2003 | Yamaguchi et al. |
| 2003/0127718 A1 | 7/2003 | Haag |

FOREIGN PATENT DOCUMENTS

| JP | 03-002535 A | 1/1991 |
| JP | 08-233851 A | 9/1996 |
| JP | 10-098201 A | 4/1998 |
| JP | 10-170380 A | 6/1998 |
| JP | 11-160348 A | 6/1999 |
| JP | 2003-151924 A | 5/2003 |
| JP | 2003-188296 A | 7/2003 |
| JP | 2003-194545 A | 7/2003 |
| JP | 2004-506327 A | 2/2004 |
| JP | 2004-096033 A | 3/2004 |
| JP | 2004-132947 A | 4/2004 |

(Continued)

*Primary Examiner* — Ha Tran T Nguyen
*Assistant Examiner* — Valerie N Brown
(74) *Attorney, Agent, or Firm* — Sughrue Mion, PLLC

(57) ABSTRACT

Provided is a semiconductor sensor device which is manufactured by an MEMS technology wherein machining technology and/or material technology is combined with semiconductor technology for detecting and measuring various physical quantities. In the semiconductor sensor device, cracks which generate in a cap chip and a molding resin are eliminated and air-tightness between a semiconductor sensor chip and the cap chip is ensured. The cracks due to vibration applied when being cut can be eliminated by having the circumference side surface of the cap chip as a wet-etched surface. Furthermore, insulation is ensured by coating the cap chip side surface with an insulating protection film.

8 Claims, 15 Drawing Sheets

FOREIGN PATENT DOCUMENTS

| | | |
|---|---|---|
| JP | 2005-524077 A | 8/2005 |
| JP | 2006-128648 A | 5/2006 |
| JP | 2006-133123 A | 5/2006 |
| JP | 2006-175554 A | 7/2006 |
| KP | 1020020010431 A | 2/2002 |
| WO | 03/093763 A1 | 11/2003 |

* cited by examiner

SEMICONDUCTOR SENSOR DEVICE AND METHOD FOR MANUFACTURING SAME

CROSS REFERENCE TO RELATED APPLICATION

This application is a National Stage of International Application No. PCT/JP2007/066552 filed Aug. 27, 2007, claiming priority based on Japanese Patent Application Nos. 2006-241089, filed Sep. 6, 2006, 2006-317972 filed Nov. 27, 2006 and 2007-011473, filed Jan. 22, 2007, the contents of all of which are incorporated herein by reference in their entirety.

TECHNICAL FIELD

The present invention relates to a semiconductor sensor device having an MEMS (Micro-Electro-Mechanical Systems) chip and a method for manufacturing it, in particular to a semiconductor sensor device provided with an MEMS chip having a movable part and a manufacture of it.

BACKGROUND ART

The MEMS technology, in which semiconductor manufacturing process technologies are incorporated with mechanically machining technologies and/or material technology to realize a system having a fine three-dimensional structure on a semiconductor substrate, can be applied to a wide variety of fields. Applications of semiconductor sensor devices manufactured by the MEMS technology to detections of physical quantities, such as acceleration, angular velocity, pressure, in fields of automobiles, aero planes, mobile terminal devices and toys, particularly attract attention from people.

These semiconductor sensor devices have a special feature in having a movable part formed by the MEMS technology. They detect displacement of the movable part by change in resistance of piezo-resistors or electro-static capacitance and process the detected data to measure the acceleration, the angular velocity, the pressure and the like. Patent documents 1 through 3 disclose acceleration sensor devices, Patent documents 4 through 6 disclose angular velocity sensor devices, and Patent documents 7 and 8 disclose pressure sensor devices.

The acceleration sensor of Patent document 1 is schematically shown in FIG. 14, and will be briefly described below, referring to the figure. A semiconductor sensor device will be explained as an acceleration sensor device, unless otherwise specified. And, details in structures of a semiconductor sensor chip for the semiconductor sensor device may be omitted from description since they are similar to those of Patent documents 1 through 8. A three-axis semiconductor acceleration sensor having a movable part manufactured by the MEMS technology is shown in an exploded perspective view of FIG. 14A. In the three-axis semiconductor acceleration sensor 10h, an acceleration sensor chip 20h and an IC regulation plate 30h are bonded by adhesive, such as resin, with a predetermined distance between them in a case 71h. Chip terminals 24h of the acceleration sensor chip 20h are connected by electric wires 51h to terminals 34h of the IC regulation plate, and the terminals 34h of the IC regulation plate are connected by electric wires 51h to case terminals 74h, and sensor signals are taken out from outer terminals 75h. A case lid 72h is fixed on the case 71h by adhesive. FIG. 14B is a plan view of the acceleration sensor chip 20h viewed from a top of the sensor. In the acceleration sensor chip 20h, a three-axis semiconductor sensor element 20h' and the chip terminals 24h are provided. The three-axis semiconductor sensor element 20h' is composed of a frame 27h, a weight 26h and pairs of beams 25h, and the weight 26h is held in a center of the frame 27h by two pairs of beams 25h. On the beams 25h, some piezo-resistors are formed. X-axis piezo-resistors 21h and Z-axis piezo-resistors 21h' are on one pair of beams, and Y-axis piezo-resistors 21h" are on the other pair of beams.

In the three-axis semiconductor acceleration sensor 10h shown in FIG. 14, the case 71h and the case lid 72h are made of ceramic, such as alumina. Since there is a limit to make the thickness of the case 71h and the case lid 72h thinner because they are made of ceramic, it is difficult to make them smaller-sized but also lighter. Since the case terminals 74h and the outer terminals 75h are formed on the ceramic case 71h and they are connected through a ceramic, the ceramic case becomes high in manufacturing cost, and it has been difficult to realize a low-priced acceleration sensor as long as a ceramic case is used. Since the case lid 72h is bonded to the case 71h with adhesive resin to air-tighten them, they tend to be less air-tight due to an environmental change because resin is used.

A structure with an improved air-tightness is described in Patent document 9. As shown in FIG. 15A, a semiconductor sensor assembled substrate 4i is constituted of a semiconductor sensor substrate 2i having a number of semiconductor sensor chips 20i manufactured by an MEMS technology, and cap substrates 3i, 3i', which have a number of cap chips 30i, 30i' formed, bonded on a top surface and a bottom surface of the semiconductor sensor substrate 2i. Movable parts of the semiconductor sensor chips 20i are air-tightened by the upper and lower cap chips 30i, 30i'. By slicing the semiconductor sensor assembled substrate 4i along cutting lines 90i, 90i' shown by dot-chain lines by a diamond cutting wheel, a semiconductor sensor assembly 40i shown in FIG. 15B is prepared. By restricting a sealed portion to the movable part of the semiconductor sensor chip 20i, it is easy to air-tighten. As shown in FIG. 15C, the semiconductor sensor assembly 40i is bonded to an inner bottom of a case 71i, and a case lid 72i is bonded to a top side of the case 71i to complete a semiconductor sensor device 10i. However, such a semiconductor sensor device enveloped in a case has been difficult to reduce its size and manufacturing cost.

A semiconductor sensor device, in which a semiconductor sensor assembly is covered with resin by applying a resin sealing technology of semiconductor as shown in Patent document 10, has started to be used in practice. FIG. 15D depicts an example of such a semiconductor sensor device 10j in which the semiconductor sensor assembly 40j is sealed with resin. By thinning a molding resin 70j to the extent that the semiconductor sensor assembly 40j and electric wires 51j are not directly exposed to outer atmosphere, miniaturizing and lightening the semiconductor sensor device can be realized. A bonding process of a case that was necessary for the semiconductor sensor device 10i of FIG. 15C is not required in the resin-sealed semiconductor sensor device 10j of FIG. 15D, and its manufacturing cost can be reduced.

| | |
|---|---|
| Patent document 1: | JP 2006-133123 A |
| Patent document 2: | JP Hei 08-233851 A |
| Patent document 3: | JP Hei 11-160348 A |
| Patent document 4: | JP 2006-175554 A |
| Patent document 5: | JP 2003-194545 A |
| Patent document 6: | JP 2005-524077 W |
| Patent document 7: | JP 2004-132947 A |
| Patent document 8: | JP Hei 10-098201 A |
| Patent document 9: | JP Hei 03-002535 A |
| Patent document 10: | JP Hei 10-170380 A |

DISCLOSURE OF THE INVENTION

Problems to be Solved by the Invention

In a process of manufacturing a large number of semiconductor sensor assemblies 40i, it has become evident that the semiconductor sensor chip 20i and cap chips 30i, 30i' have a problem with their airtightness. In FIG. 16A, the portions causing air-leakage are indicated by dashed lines; a cap chip crack 81i in the cap chip 30i and a bonding area crack 82i occurred in the bonding areas between the semiconductor sensor chip 20i and cap chips 30i, 30i', or in the proximity of the bonding areas. According to our close examination of how and why these cracks are created, the cap chip crack 81i occurs when: (a) the thickness of a cap substrate is too thin relative to the pressure applied to bond the cap substrate and a semiconductor sensor substrate; (b) a thick cap substrate bonded to the semiconductor sensor substrate is ground to make it thin; and (c) a cap substrate is diced into individual chips by a diamond cutting wheel. The bonding area crack 82i is mainly created when (d) a cap substrate is diced along the cutting line by a diamond cutting wheel to divide it into individual chips.

In addition, a semiconductor sensor device 10j in which a semiconductor sensor assembly 40j and an electric wire 51j are sealed with a molding resin that is as thin as possible but just thick enough to prevent the semiconductor sensor assembly 40j and the electric wire 51j from being directly exposed to outer atmosphere, occasionally suffers a crack 83j in the molding resin 70j as shown by a dashed line in FIG. 16B. The crack 83j occurs in the molding resin 70j near a side surface of the cap chip 30j. Some resin-molded semiconductors generate stress due to the difference in the thermal expansion coefficient between the semiconductor substrate and molding resin. The stress sometimes causes the molding resin to be peeled off from the semiconductor substrate, thereby producing a crack from where the molding resin was peeled off. For the purpose of preventing the crack, a resin layer, such as polyimide-quinone, is provided between the semiconductor substrate and molding resin to reduce the stress, and a filler, for example costly fused silica, that has a thermal expansion coefficient nearly the same as that of the semiconductor substrate is mixed with the molding resin to bring the thermal expansion coefficient of the molding resin close to the thermal expansion coefficient of the semiconductor substrate, thereby reducing the stress produced due to the difference in the thermal expansion coefficient. However, the semiconductor sensor assembly having highly irregular surfaces, in comparison with the semiconductor substrate, has difficulty in having the resin layer, such as polyimide-quinone, on its surfaces. It is also difficult to employ the molding resin mixed with the filler because of difficulties associated with electrical insulation and rising cost.

Among a large number of semiconductor sensor devices 10j each having the semiconductor sensor assembly 40j covered with the resin 70j, even though it occurs at a low incidence rate, there are some semiconductor sensor devices with failures, like noise and short circuits in electric wires, caused by the electric wire 51j touching portions other than the sensor terminal 24j of the semiconductor sensor assembly as shown in FIG. 17. The portions with which the electric wire 51j always makes contact are in the cap chip 30j, but contact never happens with the semiconductor sensor chip 20j. The electric wire 51j welded to the sensor terminal 24j rises and falls at a certain curvature to be connected to a substrate terminal 66j. The rising part of the electric wire 51j becomes deformed due to the flow of resin during resin-molding process and touches a cap-chip end 38j. The simple shape of the side surfaces of the semiconductor sensor chip are considered to simplify the movement of the resin during the resin-molding process and therefore to prevent deformation of the electric wire 51j.

More space between the cap-chip end 38j and sensor terminal 24j may prevent contact between the electric wire and the cap-chip end; however, contrary to demand for miniaturization, the semiconductor sensor device has to increase in size. On the other hand, it is possible to use an electrically insulated cap chip or to insulate the conductive cap-chip end to prevent noise and short circuits even if the electric wire touches the cap-chip end. It is also possible to use an electric wire covered with an insulation coating. However, the insulation-coated electric wires are not available for ultrasonic wire bonding and ball bonding. In addition, the use of the insulation-coated electric wires increases the curvature radius of the electric wires, which rejects the demand for miniaturization. Furthermore, the insulation-coated electric wires that are more expensive than bare wires lead to a rise of manufacturing costs.

Although the cap chip can be made of an electric insulation material, the semiconductor sensor chip made of silicon has a different coefficient of thermal expansion from that of the cap chip. It is difficult to choose and employ an insulation material having the same coefficient of thermal expansion as silicon. Thus, the difference in the coefficient of thermal expansion leads to the problem of cracks and so on. Even if glass, which has a coefficient of thermal expansion almost equal to that of silicon, is used as the insulation material, high manufacturing costs are inevitable for the difficulties in accurately machining the glass, thinning the bonded glass, and the exposing process of the electrode pads.

To cover the side surfaces of silicon cap chip, which is already assembled in a semiconductor sensor assembly, with an electric insulation material, the electrode terminal needs to be masked on its top with photoresist or the like. Since the area to be masked is positioned in a recess approximately from several tens to several hundreds micrometers away from the cap chip, forming a resist mask by photo-lithography at the area is very difficult. It is also difficult to adopt masking by tape or the like, instead of photo-lithography, in consideration of accurate positioning of the mask and the number of man-hours. On the other hand, a resin material having a high flexibility for coating can be considered; however, the resin is at risk of being degraded during heat processing, such as a reflow, performed to mount the semiconductor sensor chip on a wiring board or circuit board.

An object of the present invention is to provide a small-sized semiconductor sensor device with light weight, in which air-tightness is secured between a semiconductor sensor chip and a cap chip that are manufactured by an MEMS technology and in which cracks that may occur in the cap chip are prevented, and resin cracks in a molding resin are eliminated, and a method for manufacturing it.

Another object of the present invention is to provide a small-sized and light semiconductor sensor device, in which electric insulation between a cap chip and electric wires, otherwise noise and short circuits between wires may be caused, is secured, and a method for manufacturing it.

Means for Solving the Problems

A semiconductor sensor device of the present invention comprises:
a semiconductor sensor assembly comprising:
   a semiconductor sensor chip having a movable part and a bonding area surrounding the movable part, and
   a cap chip placed on a top surface and/or a bottom surface of the semiconductor sensor chip and having a quadrilateral base and a bonding area which is formed in a bank along a periphery of the base and is bonded to the bonding area of the semiconductor sensor chip to air-tighten the movable part of the semiconductor sensor chip;
a base plate on which the semiconductor sensor assembly is fixed and held;
electric wires connecting the semiconductor sensor chip to the base plate; and
a resin molding the semiconductor sensor assembly on the base plate;
wherein a circumference side surface of the cap chip is wet-etched.

It is desirable that the semiconductor sensor chip and the cap chip are formed in a flat plate.

The semiconductor sensor chip may include an acceleration sensor, a gyroscope sensor, a pressure sensor etc. that detect physical quantities, such as acceleration, angular velocity, pressure. When acceleration, angular velocity, pressure and the like are applied to the semiconductor sensor chip from outside, a resistor, a capacitor or the like formed on a movable part of the semiconductor sensor chip converts them to physical quantities, such as electric current, electric voltage, electro-static capacitance and outputs them.

A movable part of a semiconductor sensor chip is air-tightened in order to avoid influence due to atmosphere or pressure to an output. For example, electro-static capacitance C for an electro-static capacitor detecting an electro-static capacitance is formulated in $C=\epsilon_0 \epsilon S/d$, in which $\epsilon_0$ is dielectric constant of vacuum, $\epsilon$ is dielectric constant of gas in a semiconductor sensor assembly, S is an electrode area, and d is a distance between electrodes. Since electro-static capacitance may vary dependent on dielectric constant or atmosphere (gas) and pressure (vacuum) in the semiconductor sensor assembly, it is desirable that the semiconductor sensor assembly is air-tight. Also, for a resistor outputting electric current or voltage, resistance of the resistor may be affected by humidity and temperature in the atmosphere. So, it is preferable that a semiconductor sensor assembly is air-tightened to minimize the influence of water penetration into the semiconductor sensor assembly to measurements.

A cap chip is made of silicon. It is preferably single crystal silicon which is easy for fine machining. A semiconductor sensor chip is manufactured by applying a semiconductor technology, such as film-formation, etching, patterning, to the single crystal silicon. A cap chip is manufactured of the same material as that of the semiconductor sensor chip to match their linear thermal expansion coefficients. By doing so, the semiconductor sensor assembly becomes hard to destroy against a temperature change which may occur during the bonding of the semiconductor sensor substrate to the cap substrate and other manufacturing processes. When the cap chip is in a simple shape like a flat plate, glass, poly-crystalline silicon, ceramic and the like having almost the same linear thermal expansion coefficients as the material for the semiconductor sensor chip can be used for the cap chip. When the cap chip is not in a flat plate or is uneven, it is preferable that a material, which a wet-etching solution used in a manufacturing process of a semiconductor sensor chip can be applied to, is chosen as a cap chip material. By using such a material for the cap chip, simplification of the manufacturing process can be accomplished without increasing kinds of wet-etching solutions to use. For cap substrates between which a semiconductor sensor substrate is put, materials for an upper cap substrate and a lower cap substrate can be different. For example, single crystal silicon may be used for the upper cap substrate, and ceramic may be used for the lower cap substrate.

On a cap chip surface facing a semiconductor sensor chip, a bonding area for being fixed to the semiconductor sensor chip, s groove for dumping a drive of a movable part and open gutters for electrode pads are formed. When the open gutters for electrode pads are formed deeper than the groove for dumping a drive of a movable part, it is easy to divide into pieces. Using a semiconductor sensor assembled substrate having a semiconductor sensor substrate bonded to cap substrates, when the cap substrate is divided into cap chips by etching, a short-time etching can carry out the separation to pieces, if the open gutters for electrode pads are rather deep. The bonding area, the groove and the open gutters may be formed by photo-lithography, wet-etching and dry-etching technologies.

In the bonding area of the cap chip, a bonding material layer such as low-melting-point metal and resin is formed. The semiconductor sensor substrate and cap substrate are hermetically bonded with the bonding material. The bonding material is formed in the bonding area by lift-off, ion milling, etching, plating or the like. In the case of using a bonding material, such as low-melting-point metal and resin, having good flow properties during heating, it is desirable for the bonding area to have a groove or the like that holds back the flow of the bonding material.

Since the detector element, electric wires, electrode pads and other components on the semiconductor sensor chip are not resistant to high temperatures, it is desirable, for bonding the semiconductor sensor chip and cap chip, to employ any of anodic bonding, low-melting-point material bonding (including low-melting-point metal bonding, eutectic bonding, low-melting-point glass bonding, resin bonding, and etc.), diffusion bonding, and surface-activated bonding. It is desirable to bond the semiconductor sensor substrate and cap substrate with a low-melting-point material. The semiconductor sensor substrate and cap substrate are aligned with each other and then bonded by applying pressure and heat. Gaps caused by warps or the like of the semiconductor sensor substrate and cap substrate can be filled up with the low-melting-point material flowing therein, thereby improving airtightness. This eliminates the need to straighten the substrate warps by applying too much pressure and therefore reduces the possibility of breaking the cap substrate and other components. In order to maintain the inner space of the semiconductor sensor assembly in a vacuum (under a reduced pressure) or to fill dry nitrogen, inert gas or the like into the inner space and hermetically seal it, it is desirable to bond the semiconductor sensor substrate and cap substrate under vacuum (reduced pressure) atmosphere, dry nitrogen atmosphere or inert gas atmosphere.

In the semiconductor sensor device of the present invention, it is desirable that a circumference side surface of the semiconductor sensor chip is a wet-etched surface.

The semiconductor sensor substrate is divided into chips by wet-etching. Dividing a thick semiconductor sensor substrate into chips requires not only taking a long etching time but also controlling the side-etching amount. In order to divide the semiconductor sensor substrate with a small etching amount, it is desirable to previously form gutters on portions along which the semiconductor sensor substrate is to be separated. The gutters may be formed using a diamond cutting wheel or by dry-etching during the formation of the semiconductor sensor substrate. Forming the gutters on the separating portions by dry-etching during the formation of the semiconductor sensor substrate carries a cost advantage in that neither of the additional steps and use of another apparatus is needed.

The semiconductor sensor assembly composed of the semiconductor sensor chip and cap chip is fixed and held on a base plate which may be a wiring board or a circuit board. The base plate herein is preferably a circuit board adhered on a wiring board with resin adhesive, metal paste or the like. The semiconductor sensor assembly may be adhered onto the circuit board with resin adhesive or the like. Electrode pads of the semiconductor sensor assembly, circuit board and wiring board are connected with ultrathin metal wires (electric wires) or the like. The connection of the electrode pads and ultrathin metal wires may be made by ultrasonic welding or soldering. Instead of the ultrathin metal wires, solder balls or ball bond may be also used for the connection.

In the semiconductor sensor device of the present invention, a semiconductor sensor assembly is molded on a base plate with resin. In the resin molding, thermosetting resin, such as epoxy resin, silicon resin and phenolic resin, may be used. A potting method using liquid resin or a transformer molding method using powder resin may be employed to perform the resin molding. Under the transformer molding method, an integration of the semiconductor sensor assembly, base plate and electric wires is placed in a die; a resin tablet is loaded into a pod of a molding machine and softened by heating an extruding part of the pod; the softened resin in the pod is extruded by a plunger (pressing mechanism) into the die; and the resin is cured in the die and taken out from the die to obtain a resin-molded semiconductor sensor device. Under the potting method, an integration of the semiconductor sensor assembly, base plate and electric wires is placed in a die; a liquid resin is poured into the die; and the resin is cured and taken out from the die to obtain a resin-molded semiconductor sensor device.

The cap substrate is thinned and divided by wet-etching with an alkaline solution such as a potassium hydroxide solution, hydrazine, ethylenediamine and ammonium hydroxide-base solution. The semiconductor sensor assembled substrate is immersed in the alkaline solution to perform wet-etching. The wet-etching amount can be adjusted by changing the concentration of the alkaline solution, temperature, immersion time. The etching rate in crystal orientation also can be adjusted by mixing an organic solvent such as alcohol in the alkaline solution. Grid-like gutters formed on the cap substrate may realize simultaneous thinning and dividing of the cap substrate. When the cap substrate is divided into cap chips, separating portions on the semiconductor sensor substrate emerge. Wet-etching of the separating portions divides the semiconductor sensor substrate into semiconductor sensor chips, thereby providing semiconductor sensor assemblies. If gutters are formed in the separating portions of the semiconductor sensor substrate in advance, division of the semiconductor sensor substrate can be completed in a shorter time and a less etching amount of the semiconductor sensor chip from its side surfaces is required. The adjustment of the etching rate in crystal orientation made by mixing the organic solvent in the alkaline solution can cut down the etching amount from side surfaces, thereby making the lateral dimensional change of the semiconductor sensor chip small. While the semiconductor sensor substrate is divided into chips by wet-etching, the edge portions of the already divided cap chip are over-etched and then the circumference side surfaces of the cap chip are provided with at least two wet-etched surfaces adjacent to each other in the thickness direction of the cap chip. The two surfaces adjacent to each other in the thickness direction preferably form an angle of 90° or greater, that is, an obtuse angle.

Since a bonded wafer is immersed in an alkaline solution, cap substrates bonded on the top surface and bottom surface of a semiconductor sensor substrate can be thinned at the same time by the same thickness by wet-etching. If cap substrates having roughly the same thickness are bonded on a semiconductor sensor substrate and wet-etched, the top cap substrate and bottom cap substrate can be processed so as to have roughly the same thickness. Making the thickness of the top and bottom cap substrates equal can keep stress or the like generated in the semiconductor sensor substrate in balance, thereby reducing cracks caused by stress. In comparison with physical cutting and grinding using diamond cutting wheels, it is apparent that cutting and thinning of the cap substrate using chemical reaction represented by wet-etching produce extremely less force and vibration to be applied to the cap substrate during the processes. Wet-etching is a soft processing method that curbs generation of cracks or other failures upon cutting and thinning the cap substrate.

On each side surface of the cap chip appears a {111} crystal plane of silicon which extends in the opposite direction to the upper surface of the cap chip with inclines, and the side surface can be composed of two or more crystal planes. The side surface of the cap chip is composed of a {111} crystal plane of silicon, while the edge portion is composed of a higher-order crystal plane. The surface roughness of the side surfaces may be set to $Ra \leqq 100$ nm.

Conventionally, division of cap substrates has been performed by half-dicing the top cap substrate and bottom cap substrate in respective processes, which takes much time to cut the cap substrates. In a case of using thin cap substrates, the half-dicing is likely to cause cracks in the thin cap substrates upon cutting. The division of the cap substrates through wet-etching as performed in the present invention enables simultaneous division of the cap substrates bonded on the top and bottom surfaces of the semiconductor sensor substrate and simultaneous thinning of the two cap substrates on the top and bottom.

In the semiconductor sensor device of the present invention, it is desirable that a roughly triangular ridge-like protrusion is formed almost continuously around the entire side surfaces of the semiconductor sensor chip.

When a part (coupling) of the semiconductor sensor substrate, which remained after the gutters were formed along the cutting line of the semiconductor sensor substrate, is wet-etched to divide the substrate into semiconductor sensor chips, a {111} crystal plane of silicon appears in the thickness direction of the coupling. Etching the semiconductor sensor substrate from both the top and bottom surfaces can leave a roughly triangular protrusion in cross-section around the entire side surfaces of the semiconductor sensor chip. The roughly triangular protrusion in cross-section formed on the entire side surfaces of the semiconductor sensor chip looks like a roughly triangular ridge sticking onto the side surfaces. The cross-sectional shape of the roughly triangular ridge is not limited to a roughly-shaped isosceles triangle, but may include curved hypotenuses. In addition, the roughly triangular ridge can be almost eliminated by over-etching.

The roughly triangular ridge-like protrusion can prevent the resin material used for resin sealing in a post-process from being misaligned with and peeled off from the semiconductor sensor chip. In addition, the position and shape of the roughly triangular ridge can be adjusted according to the position of the coupling provided along the cutting line of the semiconductor sensor substrate and the thickness of the coupling. The position and shape of the roughly triangular ridge can be used as an identification marker representing the lot number and specification of the semiconductor sensor chip. Since the roughly triangular ridge formed on the side surfaces of the semiconductor sensor chip can be readily recognized visually or under a stereomicroscope, it is possible to use the roughly triangular ridge as an identification marker.

In the semiconductor sensor device of the present invention, it is desirable that each circumference side surface of the cap chip is composed of at least two surfaces adjacent to each other in the thickness direction of the cap chip. It is also desirable that the two surfaces adjacent to each other in the thickness direction form an angle of 90° or more.

The cap substrate is thinned and divided by wet-etching with an alkaline solution such as a potassium hydroxide solution, hydrazine, ethylenediamine and ammonium hydroxide-base solution. In the case where {111} silicon crystal planes are used for the side surfaces of the cap substrate, at the completion of the cap substrate division, the edge portions of the side surfaces of a cap chip are changed into an obtuse angle formed by a {100} silicon crystal plane and a {111} crystal plane intersecting with each other. Subsequent division of the semiconductor sensor substrate by wet-etching chamfers the edge portions, which are formed on the side surfaces of the cap chip and are made by two surfaces adjacent to each other in the thickness direction of the cap chip, so that each of the side surface is composed of a {111} crystal plane and a {111} crystal plane adjacent to each other in the thickness direction. The angle between the adjacent {111} crystal planes can be 90° or more.

By wet-etching the separating portions of the cap substrate with the alkaline solution, the edge portion on the side surfaces of the cap chip can have a shape in which a {100} silicon crystal plane and a {111} crystal plane or a {111} crystal plane and a {111} crystal plane intersect with each other; that is, an obtuse angle. In addition, when the semiconductor sensor substrate is divided, the side surfaces of the cap chip are wet-etched, too, which allows each side surface of the cap chip to have at least two planes. In comparison with cap chip side surfaces each having a right-angled edge portion formed by a diamond cutting wheel, the obtuse edge portions on the side surfaces of the cap chip can relax the stress applied thereto upon resin molding, thereby making it difficult to crack the molding resin.

The side surfaces of the cap substrate can be also composed of {100} silicon crystal planes. As distinct from the case using the {111} crystal planes, the use of the {100} plane for a cap substrate surface and side surfaces of the cap substrate eliminates inversely inclined side-wall portions in the cap substrate and therefore can reduce dead spaces that are difficult for molding resin to penetrate. Edge portions of the drive suppression groove, which faces a weight of the semiconductor sensor substrate, are where a {100} plane of the cap substrate surface intersects with {100} planes of the cap side surfaces, and can be rounded off to reshape the drive suppression groove into an octagon surrounded by {100} planes and {111} planes. The cap substrate is thinned and divided by wet-etching with an alkaline solution such as a potassium hydroxide solution, hydrazine, ethylenediamine and ammonium hydroxide-base solution. At the completion of division of the cap substrate, a {100} plane of the cap substrate and a {100} plane of a side surface of the cap chip intersecting therewith can form a right angle. Additional wet-etch chamfers the edge portions formed with a {100} crystal plane of the cap substrate and {100} crystal planes of the side surfaces of the cap chip to make each edge portion into an obtuse-angled edge portion formed with the {100} crystal plane of the cap substrate and the {100} crystal plane of the side surface with a higher-order crystal plane sandwiched between.

In the semiconductor sensor device of the present invention, the circumference side surface of the cap chip is preferably coated with an insulating protection film on a wet-etched surface of the side surface. In addition, the insulating protection film is preferably proof against alkali, and more preferably is 0.1 μm or more in thickness.

It is desirable to form the insulating protection film on the cap chip side surfaces that are likely to make contact with electric wires. Surfaces other than the cap chip side surfaces, namely a surface facing the semiconductor sensor chip and a surface on the back side with respect to the surface facing the semiconductor sensor, are optionally available for the insulating protection film. Since there is no chance for the back surface of the cap chip to make contact with the electric wires, the back surface of the cap chip does not require having the insulating protection film thereon after being thinned and divided by wet-etching. The insulating protection film formed on the surface of the cap chip facing the semiconductor sensor chip can protect the surfaces of the cap chip, except for the back surface, from a wet-etching solution, thereby stabilizing the shape and dimension of the cap chip. The insulating protection film formed on the surface facing the semiconductor sensor chip and the side surfaces of the cap chip are preferably a continuously formed film. Even if the cap chip has the insulating protection film on its bonding area used for bonding the semiconductor sensor chip, the insulating protection film does not affect bonding and airtightness between the cap chip and semiconductor sensor chip. Forming the insulating protection film on the entire surface of the cap substrate facing the semiconductor sensor substrate eliminates the necessity of forming resist patterns and therefore can reduce the manufacturing cost.

On the surface of a cap chip of the present invention facing a semiconductor sensor chip, there are a bonding area to be bonded with the semiconductor sensor chip, a groove for dumping a drive of a movable part, cap chip side surfaces and open gutters for electrode pads. During wet-etching for thinning and dividing into cap chips, a part of the cap chip side surface and the electrode pad open gutters are removed by etching. Making the depth of the open gutters for the electrode pads deeper than that of the groove for dumping a drive of the movable part facilitates division into the cap chips. After a semiconductor sensor assembled substrate is completed by bonding the semiconductor sensor substrate and cap substrate, the cap substrate is thinned by etching to completely divide it into chips along the open gutters for the electrode pads. The division of the cap substrate into cap chips may be carried out by mechanically removing the insulating protection film remaining alone on the part of the cap chip side surfaces and open gutters for the electrode pads. The amount (thickness) to be removed by etching for thinning the cap substrate needs to be larger than the thickness of the silicon corresponding to the open gutters for the electrode pads. Although the silicon forms an acute angle at its edges, edges of the insulating protection film that remains after the mechanical removal of the other part of the insulating protection film combines with the silicon edges to form an obtuse angle together.

In the semiconductor sensor device of the present invention, it is desirable that the insulating protection film formed on the circumference side surface of the cap chip has an electrical resistance rate of $10^{10}$ Ω·cm or more and the insulating protection film is proof against alkali.

In order to prevent noise and short circuits even when the electric wires touch the cap chip, it is desirable for the insulating protection film to have a greater electrical resistance rate. In addition, the insulating protection film should not be etched by alkaline etchant solutions during the thinning and dividing process into cap chips. Furthermore, the insulating protection film needs to be a closely-packed defect-free film so that the etchant solutions cannot penetrate through the insulating protection film. As a material of the insulating protection film which can be formed by sputtering or CVD, silicon dioxide ($>10^{14}$ Ω·cm), silicon nitride ($>10^{14}$ Ω·cm), alumina ($>10^{14}$ Ω·cm), zirconia ($10^{13}$ Ω·cm) and other materials are available. It is also possible to use a lamination of these materials. Since the cap substrate is made of single crystal silicon, a silicon dioxide film can be formed by thermal oxidation after the groove for dumping a drive of the movable part and open gutters for electrode pads are formed.

Insulating protection films having a thickness of 0.1 μm or more can be closely-packed films that ensure insulating properties and prevent etchant penetration. It is desirable that the insulating protection film remaining on one part of the cap chip side surfaces and the open gutters for the electrode pads can be mechanically removed with ease, while the insulating protection film on the other part of the cap chip side surfaces has a film strength and a film bond strength strong enough not to be peeled off. Although the upper limit of the film thickness of the insulating protection film is slightly different depending on its material, it can be set up to approximately 3 μm.

The thinning and dividing process of the cap substrate by wet-etching leaves only an insulating protection film on a part of the cap side surfaces and open gutters for the electrode pads. Since the insulating protection film is thin, the insulating protection film can be readily removed by agitating it in an etchant solution or cleaning liquid or applying ultrasonic. Alternatively, gentle brushing can also remove the insulating protection film. The completion of the insulating protection film removal substantially means that substantial division of the cap substrate into cap chips has been done. Since the insulating protection film formed on the wet-etched side surfaces of the cap chip has great adherability, even if the other insulating protection film to be removed is removed by ultrasonic or a brush, the insulating protection film that is planned to remain on the cap side surfaces can never be removed.

The removal method of the insulating protection film may be changed according to the thickness of the insulating protection film. It is noted that the material of the insulating protection film should be taken into account; however, as a guide, appropriate removal methods are the following: insulating protection films having a thickness of 0.1 to 0.5 μm are agitated in an etchant solution or cleaning liquid; insulating protection films having a thickness of 0.3 to 1.0 μm are applied with ultrasonic in cleaning liquid; and insulating protection films having a thickness of 1.0 μm or more are suited to be mechanically removed by a brush. The thicker the insulating protection film is, the more difficult it is to remove the film and the higher the cost for machinery and equipment. For those reasons, making the insulating protection film as thin as possible is desirable for manufacturing cost.

In the semiconductor sensor device of the present invention, other surfaces of the semiconductor sensor chip than a circumference side surface of the semiconductor sensor chip are preferably coated with a material resistant to alkaline solutions.

The semiconductor sensor substrate and the cap substrate are thinned and divided in an alkaline solution by wet-etching. When wet-etching is performed, the movable part of the semiconductor sensor chip, which is hermetically fixed in the cap chip, is not exposed to the wet-etching solution, but parts of the semiconductor sensor chip other than the movable part are exposed to the wet-etching solution, and therefore it is desirable to coat the parts with a material resistant to the alkaline solution so as not to be wet-etched. As the material resistant to the alkaline solution, a noble metal material is used to coat the electrode pads, while a film of silicon dioxide, silicon nitride or the like having a thickness of at least 0.05 μm is used to coat the other parts except for the electrode pads. The movable part of the semiconductor sensor chip may also be coated with a material resistant to the alkaline solution. A film of silicon dioxide or silicon nitride may be formed by CVD (Chemical Vapor Deposition), sputtering or the like. The noble metal material may be formed by sputtering, vacuum deposition or the like. The formed silicon dioxide film, silicon nitride film and noble metal material film may be patterned by photo-lithography, dry-etching or the like. If the bonding material for bonding the cap substrate to the semiconductor sensor substrate is the same as the noble metal material used as the material resistant to the alkaline solution, these films may be simultaneously formed, which reduces the manufacturing steps. There is no need to remove the material resistant to the alkaline solution after the completion of the wet-etching operation.

In the semiconductor sensor device of the present invention, the circumference side surface of the semiconductor sensor chip may be a surface mechanically cut or cut by laser.

The semiconductor sensor chip may have side surfaces cut by a cutting wheel (i.e., diced surfaces), while the cap chips on the top and bottom of the semiconductor sensor chip may have wet-etched side surfaces. After the cap substrate is thinned and divided by wet-etching, the semiconductor sensor substrate is cut off by a diamond cutting wheel to obtain semiconductor sensor assemblies. Alternatively, the side surface of the semiconductor sensor chip may be a surface cut by laser, while the side surfaces of the top and bottom cap chips may be wet-etched surfaces. The laser used to divide the semiconductor sensor substrate may be excimer laser, YAG laser, femto-second laser or carbon dioxide gas laser. The carbon dioxide gas laser having great laser power realizes rapid cutting of the semiconductor sensor substrate, thereby decreasing work time. In addition, use of the laser eliminates the need for spraying grinding coolant, which prevents cracks in the bonding area. Furthermore, the cutting of the semiconductor sensor substrate by laser does not produce chipping.

A method for manufacturing a semiconductor sensor device of the present invention comprises:

providing a semiconductor sensor substrate comprising a plurality of semiconductor sensor chips each having a movable part and a bonding area surrounding the movable part, and a cap substrate comprising a plurality of cap chips each having a quadrilateral base and a bonding area which is formed in a bank-like shape along a periphery of the base;

placing the cap substrate on at least one of a top surface and a bottom surface of the semiconductor sensor substrate to bond the bonding area of each of the plurality of cap chips to the bonding area of each of the plurality of semiconductor sensor chips to form a semiconductor sensor assembled substrate in which the movable part of each of the plurality of semiconductor sensor chips is air-tightened with each of the plurality of cap chips;

immersing the semiconductor sensor assembled substrate in a wet-etching solution to thin the cap substrate and to divide the cap substrate into the plurality of cap chips by wet-etching the cap substrate in the thickness direction of the cap substrate;

dividing the semiconductor sensor substrate into the plurality of semiconductor sensor chips, during or after the time the cap substrate is thinned, to form a semiconductor sensor assembly in which a cap chip is fixed to a semiconductor sensor chip; and
bonding and fixing the semiconductor sensor assembly onto a base plate, connecting the semiconductor sensor chip to the base plate with electric wires and molding the semiconductor sensor assembly on the base plate with a resin. It is desirable to apply the top surface and bottom surface, except for the bonding area, of the semiconductor sensor chip with a coating resistant to an alkaline solution.

In the method for manufacturing the semiconductor sensor device of the present invention, it is desirable that a circumference of each of the plurality of semiconductor sensor chips of the semiconductor sensor substrate is wet-etched from a top and a bottom during the time the semiconductor sensor assembled substrate is immersed in the wet-etching solution to divide the semiconductor sensor substrate into the plurality of semiconductor sensor chips to form the semiconductor sensor assembly in which the cap chip is fixed to the semiconductor sensor chip.

In the method for manufacturing the semiconductor sensor device of the present invention, the semiconductor sensor substrate may be mechanically cut or cut by laser, after the semiconductor sensor assembled substrate is immersed in the wet-etching solution to wet-etch and to thin the cap substrate in the thickness direction of the cap substrate, to divide into the plurality of semiconductor sensor chips to form the semiconductor sensor assembly in which the cap chip is fixed to the semiconductor sensor chip.

In the method for manufacturing the semiconductor sensor device of the present invention, the cap substrate may have the plurality of cap chips having insulating protection films on surfaces other than the bonding areas of the cap chips.

ADVANTAGES OF THE INVENTION

The semiconductor sensor device of the present invention employing wet-etching to cut the cap substrate to divide it into cap chips does not suffer from cracks in its cap chip and molding resin and can ensure airtightness between the semiconductor sensor chip and the cap chip. In addition, the cap chip having side surfaces coated with an insulating protection film prevents insulation failures even if an electric wire contacts a side surface of the cap chip.

BRIEF DESCRIPTION OF DRAWINGS

FIG. 1 shows a semiconductor sensor chip used in a semiconductor sensor device of EXAMPLE 1 of the present invention, wherein

FIG. 2 shows a semiconductor sensor substrate having a plurality of semiconductor sensor chips of FIG. 1, wherein

FIG. 3 shows a cap substrate having a plurality of cap chips for use in the semiconductor sensor device of EXAMPLE 1, wherein

FIG. 5 shows a semiconductor sensor substrate having a plurality of semiconductor sensor chips for use in a semiconductor sensor device of EXAMPLE 2, wherein

FIGS. 6A to 6G are explanatory views of a manufacturing process of the semiconductor sensor device of EXAMPLE 2;

FIG. 11 shows a cap substrate for use in EXAMPLE 10, wherein

FIG. 14 shows a structure of an acceleration sensor described in a document, wherein

EXPLANATION OF REFERENCE NUMERALS

| | |
|---|---|
| 2a, 2b, 2c, 2e, 2g: | Semiconductor sensor substrate |
| 3a, 3a', 3b, 3b', 3c, 3c', 3e, 3e', 3f, 3g: | Cap substrate |
| 4a, 4b, 4c, 4e, 4g: | Semiconductor sensor assembled substrate |
| 10a, 10b, 10e, 10g: | Semiconductor sensor device |
| 10d: | Gyroscope sensor device |
| 20a, 20b, 20g: | Semiconductor sensor chip |
| 20d: | Gyroscope sensor chip |
| 23a, 23a', 23e, 23e', 23g, 33a, 33b, 33e, 33f, 33g: | Bonding area |
| 30a, 30a', 30b, 30b', 30c, 30c', 30d, 30d', 30e, 30g: | Cap chip |
| 35b, 35c: | Circumference side surface |
| 37e, 37f, 37g: | Insulating protection film |
| 40a, 40b, 40c, 40d, 40e, 40g: | Semiconductor sensor assembly |
| 51a, 51b, 51g: | Electric wire |

BEST MODE FOR CARRYING OUT OF THE INVENTION

With reference to the drawings, the present invention will be described with EXAMPLES in detail below. For the sake of clarity, the same components and parts may be denoted by the same numerals.

Example 1

According to EXAMPLE 1 of the present invention, with reference to FIGS. 1 to 4, the structure of a semiconductor sensor device and a manufacturing process will be now described with an acceleration sensor device as an example. In the following description, a semiconductor sensor substrate and a semiconductor sensor chip manufactured by an MEMS technology are treated as synonymous with an acceleration sensor substrate and an acceleration sensor chip, respectively. FIGS. 1A and 1B are perspective views of a semiconductor sensor chip viewed from the top and the bottom, respectively; FIGS. 2A and 2B are a plan view and a cross-sectional view of the semiconductor sensor substrate, respectively; FIGS. 3A and 3B are a plan view and a cross-sectional view of the cap substrate, respectively; and FIGS. 4A to 4G are explanatory views of a manufacturing process of the semiconductor sensor device.

Figure 1A:
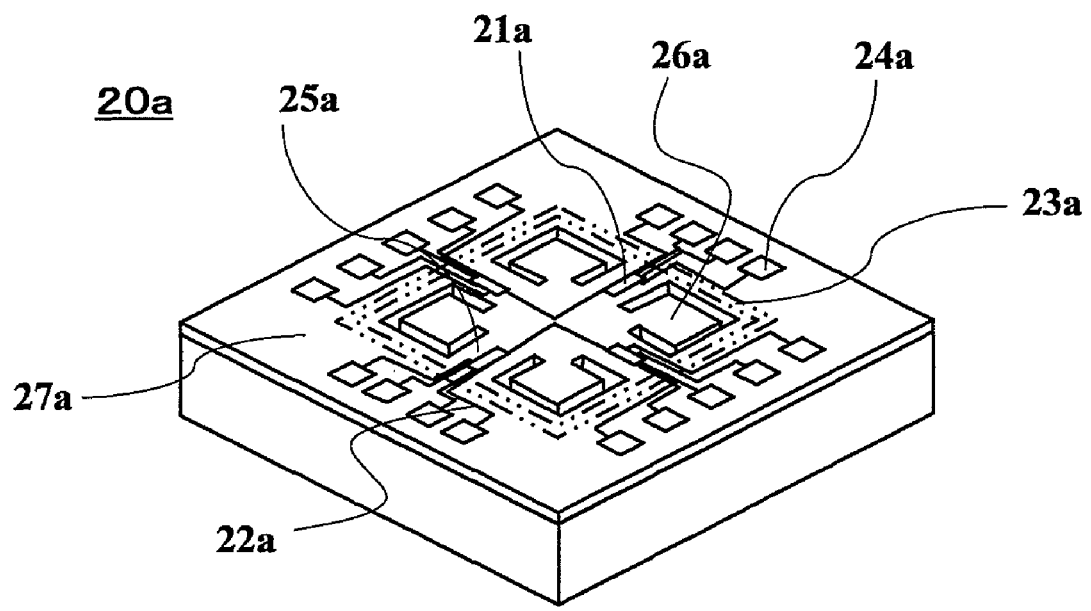
FIG. 1A is a perspective view of the semiconductor device chip viewed from the top.
Figure 1B:
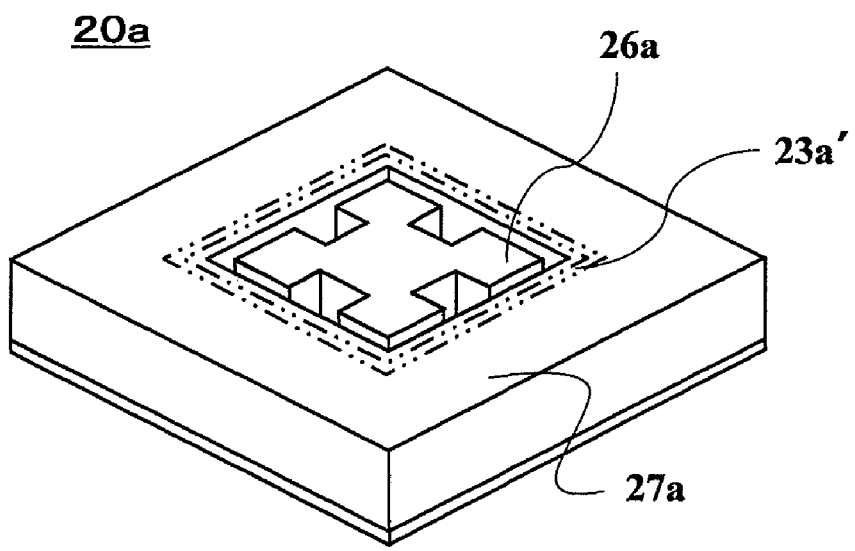
FIG. 1B is a bottom perspective view of it.
Figure 2A:
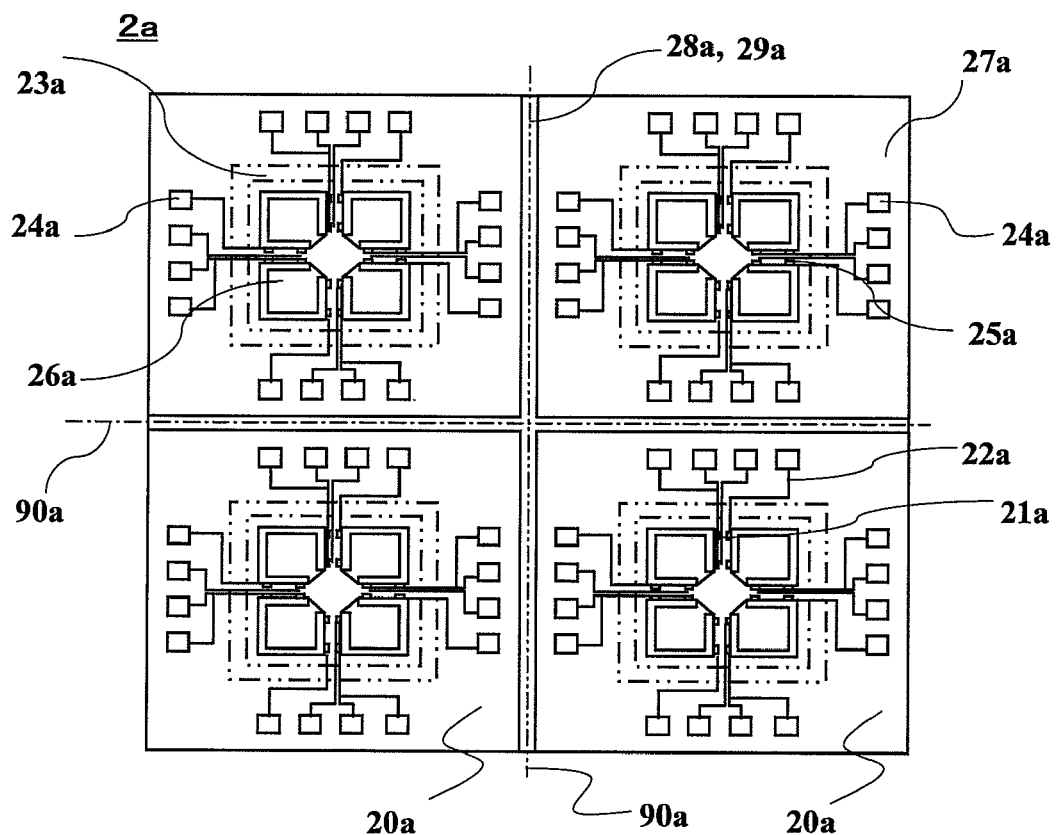
FIG. 2A is a plan view of the semiconductor sensor substrate.
Figure 2B:
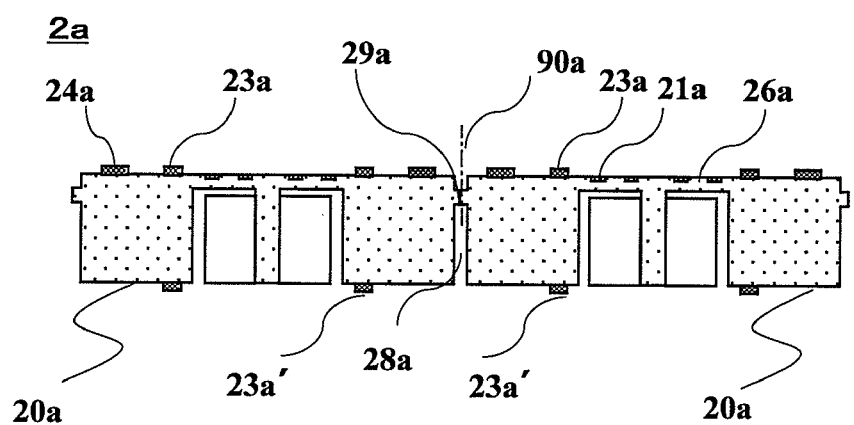
FIG. 2B is a cross-sectional view of it.

As shown in FIGS. 1A and 1B, a semiconductor sensor chip (acceleration sensor chip) 20a is composed of piezo-resistors 21a, electric wires 22a, electrode pads 24a, a bonding area 23a or 23a' defined by chain double-dashed lines, beams 25a, a weight 26a and a frame 27a. To manufacture the semiconductor sensor chip 20a, an SOI (Silicon on Insulator) wafer was used in which a silicon dioxide layer having a thickness of several micrometers and a silicon layer having a thickness of approximately 6 µm were laminated on a silicon plate having a thickness of approximately 400 µm. A semiconductor sensor substrate (acceleration sensor substrate) 2a in which a large number of semiconductor sensor chips 20a are formed on a wafer is partially illustrated in the plan view of FIG. 2A and the cross-sectional view of FIG. 2B. The plurality of semiconductor sensor chips 20a were connected through couplings 29a in the semiconductor sensor substrate 2a and were separated along cutting lines 90a indicated by dashed dotted lines to divide the substrate into the chips. On the top and bottom surfaces of the semiconductor sensor substrate 2a, bonding areas 23a and 23a' were provided, respectively, to bond with cap substrates. In each bonding area, a lamination of chromium, nickel and gold was formed in this order, and the gold layer was on the top of the bonding areas. Dividing gutters 28a around the semiconductor sensor chips 20a were formed simultaneously with formation of the beams 25a and weights 26a.

The following is a detailed description about a manufacturing process of the semiconductor sensor substrate 2a. The silicon layer, of the SOI wafer, having a photoresist pattern in the shape of the piezo-resistors 21a on the upper surface thereof was implanted with boron of 1 to $3 \times 10^8$ atoms/cm$^3$ to form the piezo-resistors 21a. The electric wires 22a connected to the piezo-resistors 21a were formed by metal sputtering and dry-etching.

After the piezo-resistors 21a, electric wires 22a and electrode pads 24a of the semiconductor sensor (acceleration sensor) were formed, silicon nitride of 0.1 µm was deposited over them by CVD, and the silicon nitride on the electrode pads was removed by photo-lithography and etching. Next, a photoresist film was added onto the entire surface. After the photoresist films formed on the electrode pads 24a and bonding areas 23a, 23a' were opened, a lamination film was formed by depositing chromium of 0.1 µm in thickness, nickel of 0.2 µm in thickness and gold of 0.5 µm in thickness in this order by metal sputtering. Subsequent to removal of the photoresist film, the metal films were removed except for the metal films formed on the electrode pads 24a and bonding areas 23a, 23a' to leave the metal lamination films on the electrode pad 24a and bonding areas 23a, 23a'. The parts to be exposed to a wet-etching solution were protected by silicon nitride films left thereon.

The silicon layer of the SOI wafer was treated by photo-lithography and dry-etching to form grooves between the beams and frame and between the frame and weight so as to form grooves with the beams 25a, weight 26a and frame 27a left in the silicon layer, and to form dividing gutters 28a. The dry-etching was performed in plasma generated by alternately introducing $SF_6$ and oxygen mixed gas and $C_4F_8$ gas. The silicon dioxide layer functions as an etching stopper when silicon is dry-etched. In dry-etching, only silicon is etched but not the silicon dioxide layer.

Next, the SOI wafer was turned over to form a resist pattern having an open space between the weight and frame on the rear surface of the silicon plate. After the groove between the weight 26a and frame 27a, the grooves between the beams and frame and parts of the beams were dry-etched by 100 µm from the rear surface of the silicon plate, photoresist was patterned into the shape of the dividing gutters 28a. Then, a weight 26a, frame 27a, beams 25a and dividing gutters 28a were formed by performing dry-etching. By these processes, the dividing gutters 28a were formed 100 µm shallower than the grooves between the weight 26a and frame 27a and between the beams 25a and frame 27a to leave a coupling 29a in the dividing gutter 28a. The coupling 29a had a thickness of 100 µm and a length of 80 µm. Subsequent to the dry-etching, the SOI wafer was immersed in a hydrofluoric acid and ammonium fluoride solution to remove the silicon dioxide layer through wet-etching.

Figure 3A:
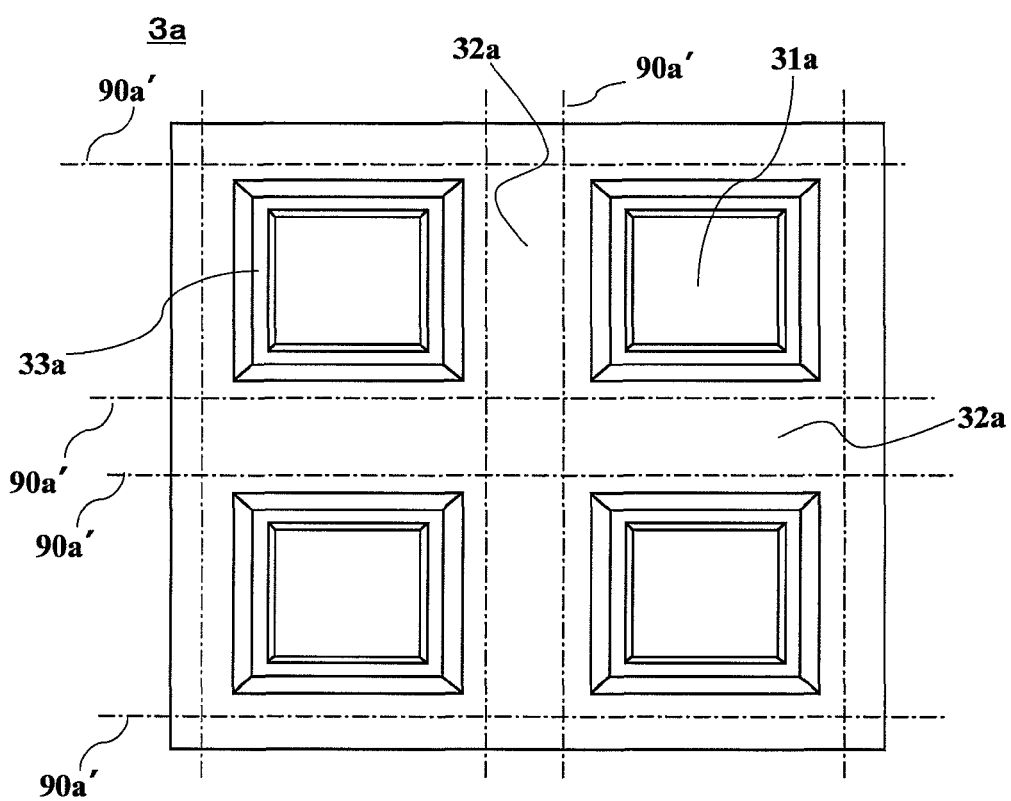
FIG. 3A is a plan view of the cap substrate.
Figure 3B:
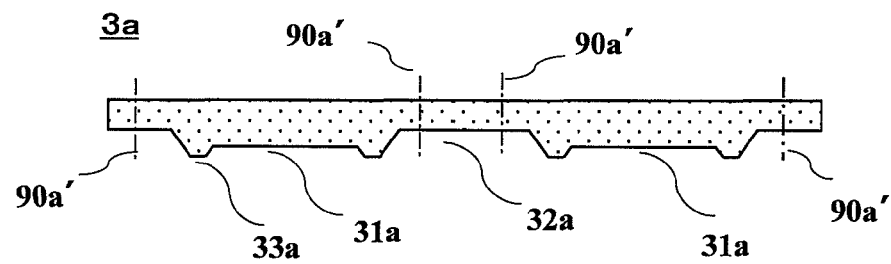
FIG. 3B is a cross-sectional view of it.

FIG. 3 partially illustrates a cap substrate 3a. FIG. 3A is a plan view of the cap substrate 3a viewed from the bonding area 33a, while FIG. 3B is a cross-sectional view of FIG. 3A. The cap substrate 3a is a silicon flat plate having a thickness of 400 µm and has one surface with drive suppression grooves 31a each having a quadrilateral base, depressed separating gutters 32a, and projecting bonding areas 33a provided in a bank-like shape along the perimeter of the drive suppression grooves 31a. After a silicon dioxide film having a thickness of 0.5 µm was stacked on the one surface of the silicon flat plate, a resist pattern for the drive suppression grooves 31a facing the weights was formed and the silicon dioxide in the areas to be the drive suppression grooves 31a was etched and removed. Subsequently, a silicon nitride film of 0.1 µm in thickness was stacked on the entire surface of the cap substrate by CVD. A resist pattern was formed on the silicon nitride film, and the silicon nitride film in the areas corresponding to the separating gutters 32a of the cap substrate was removed. Then, the cap substrate was wet-etched with a potassium hydroxide solution (40 wt. %) at 67° C. to form the separating gutters 32a of 85 µm in depth. Removal of the silicon nitride film of the entire surface of the cap substrate resulted in the drive suppression grooves 31a of 15 µm in depth and the separating gutters 32a of 100 µm in depth by additionally wet-etching the separating gutters 32a by 15 µm. On the bonding areas 33a in a bank shape formed between the separating gutter 32a and drive suppression groove 31a, a gold-tin alloy film having a thickness of 3 µm was formed by vacuum deposition.

Each of the bonding areas 23a, 23a', 33a was set to have a width of 60 μm that could provide good airtightness. The cap substrate 3a having a thickness of 400 μm had a sufficient strength against pressure of approximately 10 kN generated when the cap substrate 3a was bonded onto the acceleration sensor substrate 2a under pressure, and therefore the cap substrate 3a did not suffer from breakage and cracks upon the pressure bonding.

Figure 4A:
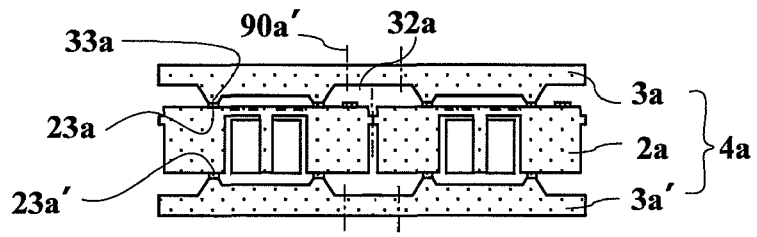
FIGS. 4A to 4G are explanatory views of a manufacturing process of the semiconductor sensor device of EXAMPLE 1.
Figure 4B:
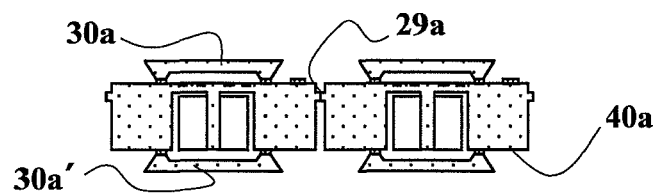
Figure 4C:
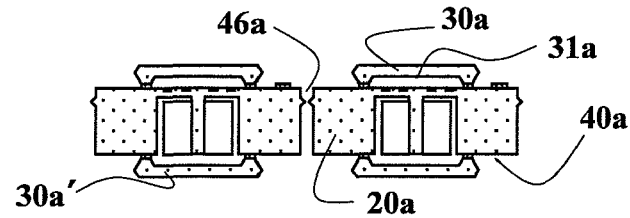

With FIG. 4, a description will be made about a manufacturing process of the semiconductor sensor device (acceleration sensor device) of EXAMPLE 1. On the top and bottom surfaces of the semiconductor sensor substrate 2a, cap substrates 3a, 3a' were bonded, respectively, to provide a semiconductor sensor assembled substrate (acceleration sensor assembled substrate) 4a (FIG. 4A). The semiconductor sensor assembled substrate 4a was immersed in a potassium hydroxide solution (40 wt. %) heated at 67° C. to etch the cap substrates 3a, 3a' by 300 μm in the thickness direction of the cap substrates. The separating gutters 32a were removed along the cutting line 90a' by thinning the cap substrates 3a, 3a' and the thinning of the cap substrates provided separated cap chips 30a and 30a' (FIG. 4B). With a solution in which isopropyl alcohol was saturated in a potassium hydroxide solution (40 wt. %), the semiconductor sensor substrate 2a was divided into chips, while the cap chips 30a, 30a' were further thinned and the edge portions of the side surfaces of the cap chips were etched, thereby obtaining semiconductor sensor assemblies (acceleration sensor assemblies) 40a (FIG. 4C). The coupling 29a of 100 μm in thickness of the semiconductor sensor substrate was wet-etched from both the top and bottom sides by 50 μm each to separate the semiconductor sensor assembled substrate into semiconductor sensor chips 20a. Then, the cap chips 30a, 30a' were also additionally etched by 50 μm so that the thickness of the cap chips corresponding to the drive suppression grooves 31a was reduced to 50 μm. The use of the wet-etching solution with the saturated isopropyl alcohol left protrusions 46a in the shape of a roughly triangular ridge of approximately 30 μm in height on the side surfaces of the semiconductor sensor chip. The roughly triangular ridge-like protrusions 46a, which can be readily recognized visually or under a stereomicroscope, may be available as an identification marker to distinguish the semiconductor sensor assemblies 40a by the lot number, specification or the like.

Figure 4D:
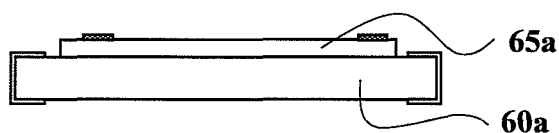
Figure 4E:
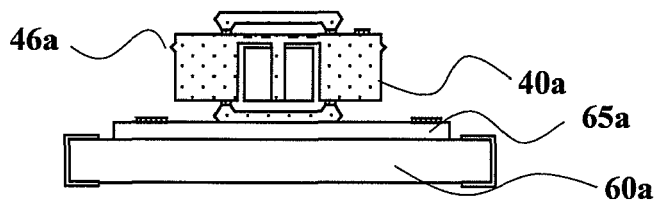
Figure 4F:
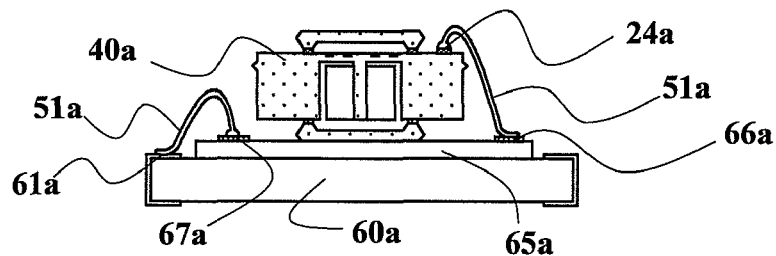

A circuit board 65a, which performs amplification of signals from semiconductor sensor devices, temperature adjustment and so on, was adhesively fixed with an epoxy adhesive on a wiring board 60a having a thickness of 200 μm (FIG. 4D). The semiconductor sensor assembly 40a was adhesively fixed on the circuit board 65a with an epoxy-based resin (FIG. 4E). An electrode pad 24a of the semiconductor sensor assembly 40a and an electrode pad 66a of the circuit board 65a, and an electrode pad 67a of the circuit board 65a and an electrode pad 61a of the wiring board 60a were connected, respectively, with bare gold wires 51a having a diameter of 25 μm (FIG. 4F).

Figure 4G:
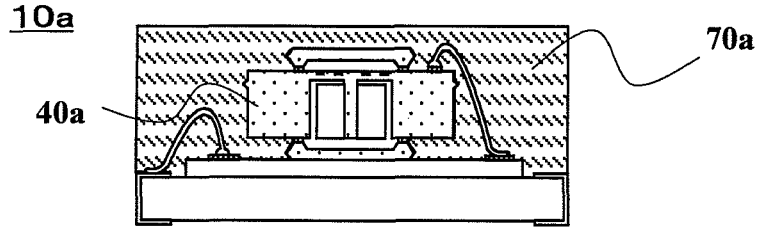

The structure in which the semiconductor sensor assembly 40a, circuit board 65a and wiring board 60a were assembled was molded with an epoxy resin 70a by a transformer molding method. The transformer molding operations were carried out through the following steps and under the conditions below. A structure in which a semiconductor sensor assembly 40a, circuit board 65a and wiring board 60a were assembled was held within a molding die. A resin tablet loaded in a pod of a molding machine was softened by heating an extruding part of the pod, and a plunger (pressing mechanism) pressed the softened resin at 175° C. in the pod into the mold die at 5 MPa. The molding time was two minutes. After the resin was cured in the molding die, the resin molded product was taken out from the molding die, resulting in a semiconductor sensor device 10a (FIG. 4G). We used a molding die capable of providing fifty semiconductor sensor devices 10a through a series of the transformer molding operations.

Example 2

Figure 5A:
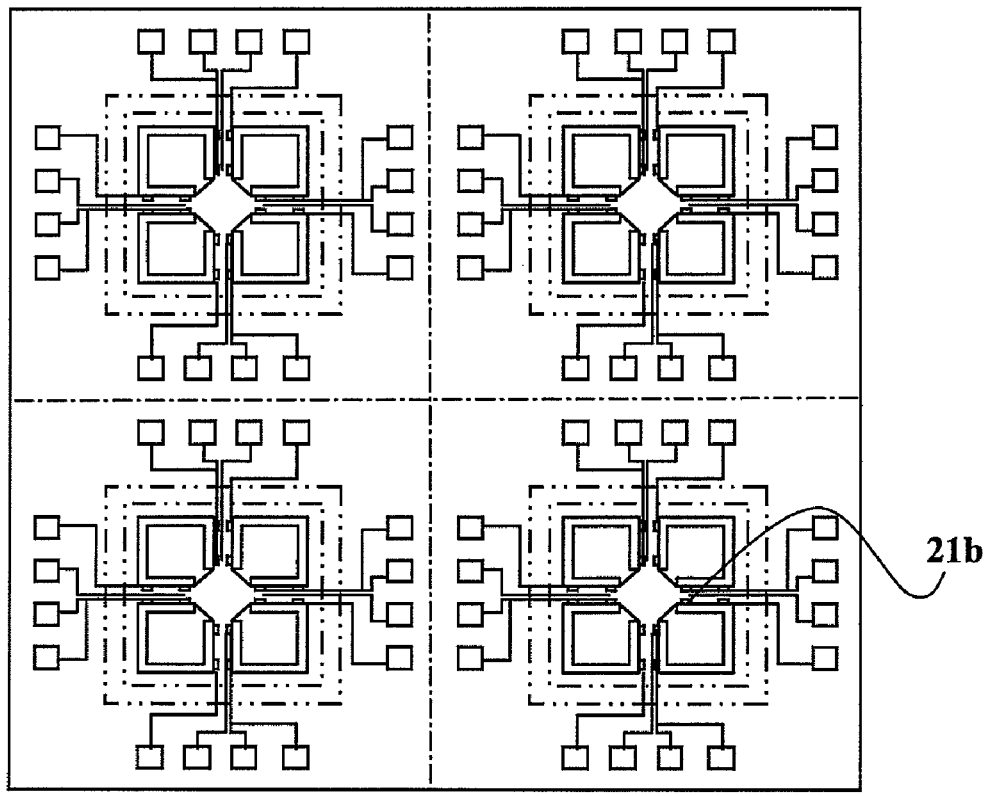
Figure 5B:
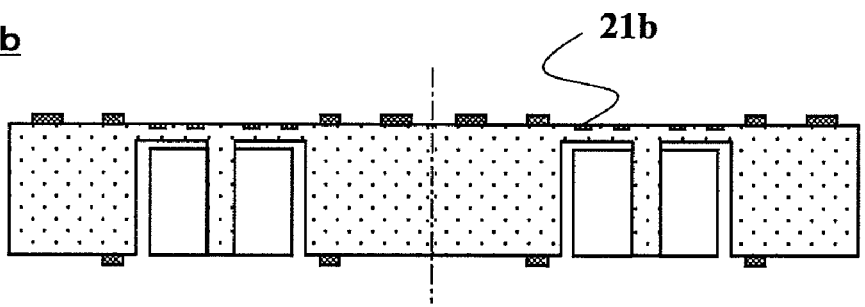
FIG. 5B is a cross-sectional view of it.

With reference to FIGS. 5 and 6, a semiconductor sensor device (acceleration sensor device) in EXAMPLE 2 of the present invention will be described. FIG. 5 partially illustrates the semiconductor sensor substrate (acceleration sensor substrate) 2b. FIG. 5A is a plan view of the semiconductor sensor substrate 2b on the side having piezo-resistors 21b; and FIG. 5B is a cross-sectional view of FIG. 5A. FIGS. 6A to 6G are explanatory views of a manufacturing process of the semiconductor sensor device 10b of EXAMPLE 2. The semiconductor sensor substrate 2b in FIG. 5 has the same structure and components as the semiconductor sensor substrate of EXAMPLE 1 except for the lack of dividing gutters 28a and couplings 29a, which are provided in the semiconductor sensor substrate of EXAMPLE 1, and therefore its detailed description will be omitted. The shape and material of cap substrates 3b, 3b' were also the same as those of the cap substrate 3a in EXAMPLE 1.

The manufacturing process of the semiconductor sensor device 10b of EXAMPLE 2 will be now described by referring to FIG. 6. The cap substrates 3b, 3b', which were made of a silicon flat plate having a thickness of 400 μm and each includes drive suppression grooves 31b, depressed separating gutters 32b and projecting bonding areas 33b, were bonded on the top surface and bottom surface of the semiconductor sensor substrate 2b, respectively, resulting in a semiconductor sensor assembled substrate (acceleration sensor assembled substrate) 4b (FIG. 6A). The semiconductor sensor assembled substrate 4b was immersed in a potassium hydroxide solution (40 wt. %) heated to 67° C. to wet-etch and thin the cap substrates 3b, 3b' in order to divide them into cap chips 30b and 30b'. In EXAMPLE 1, wet-etching performed for dividing the semiconductor sensor substrate 2a into chips could simultaneously provide an additional thinning step to the cap substrates 3a, 3a'; however, in EXAMPLE 2 where the semiconductor sensor substrate 2b was separated by a diamond cutting wheel, the cap substrates required a larger number of wet-etching operations for thinning themselves than EXAMPLE 1. The cap substrates 3b, 3b' were wet-etched in the thickness direction by 340 μm so that the silicon thickness of the cap substrates corresponding to the drive suppression grooves 31b was reduced to 60 μm. Each of the cap substrates 3b and 3b' was divided into individual cap chips 30b and 30b' by removing the silicon corresponding to the separating gutters 32b. Subsequently, the cap chips 30b, 30b' were wet-etched by 10 μm in a solution in which isopropyl alcohol was saturated in a potassium hydroxide solution (40 wt. %) to reduce the thickness of silicon behind the drive suppression grooves 31b to 50 μm. This additional wet-etching of 10 μm created two or more planes on the side surfaces 35b of the cap chips 30b, 30b', and the two planes formed an angle of 90° or more (FIG. 6B).

Figure 6A:
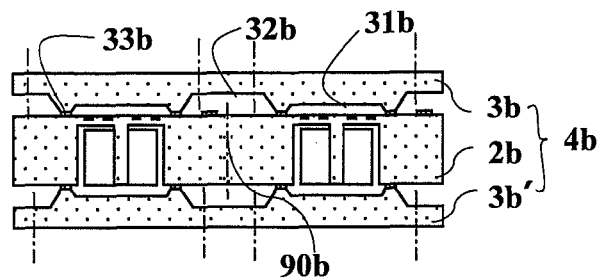
FIG. 6A is a plan view of the semiconductor sensor substrate.
Figure 6B:
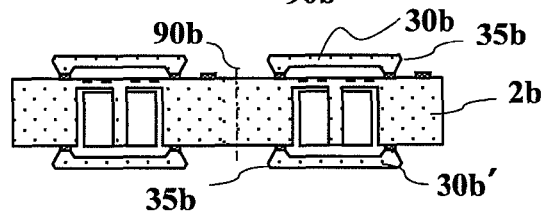
Figure 6C:
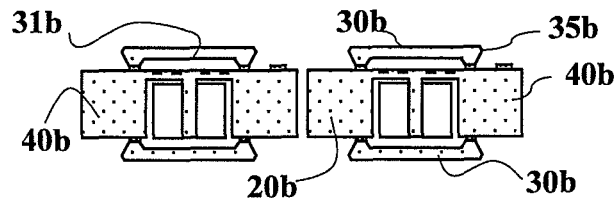
Figure 6D:
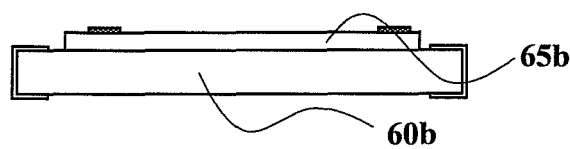
Figure 6E:
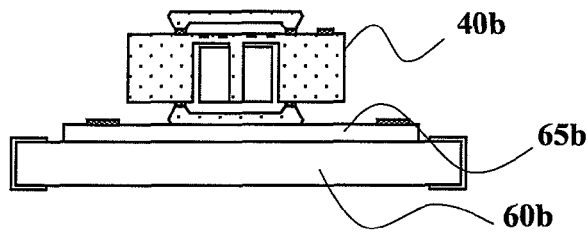
Figure 6F:
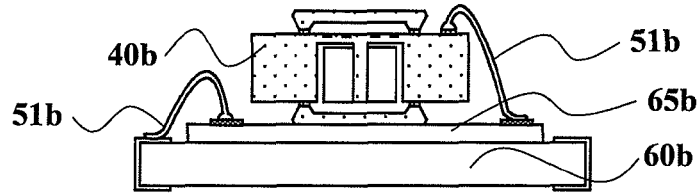
Figure 6G:
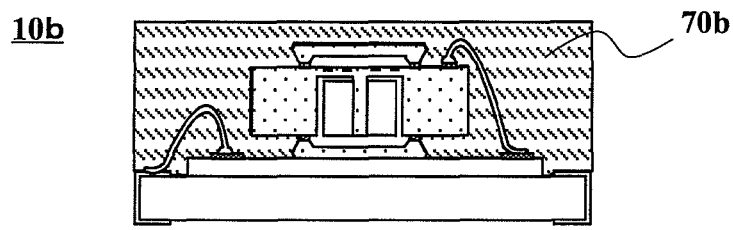

After the cap substrates 3b, 3b' were divided into individual cap chips 30b, 30b', the semiconductor sensor substrate 2b was cut off along the cutting line 90b by a 2000-grit diamond cutting wheel to obtain semiconductor sensor chips (acceleration sensor chips) 20b. The cutting was performed at a wheel speed of 20000 rpm with a grinding coolant of 3 to 5 liters/min poured over the diamond cutting wheel and semiconductor sensor assembled substrate 4b. The surface roughness of the side surfaces of the semiconductor sensor resulted in Ra≦200 nm. The surface roughness Ra was measured according to JIS B0601. The semiconductor sensor substrate 2b was divided to obtain semiconductor sensor assemblies 40b (FIG. 6C). A circuit board 65b was adhesively fixed on a wiring board 60b (FIG. 6D) to form an assembly of the wiring board 60b and circuit board 65b. After a semiconductor sensor assembly 40b was adhered onto the assembly (FIG. 6E), the wiring board 60b, circuit board 65b and semiconductor sensor assembly 40b were electrically connected with electric wires 51b (FIG. 6F), and the structure in which the semiconductor sensor assembly 40b, circuit board 65b and wiring board 60b were assembled was completely molded in an epoxy resin 70b by a potting method, thereby obtaining a semiconductor sensor device 10b (FIG. 6G). The steps from FIG. 6D to FIG. 6F were carried out under the same manufacturing conditions as those of EXAMPLE 1 and their descriptions will be omitted. In the step of FIG. 6G, the structure in which the semiconductor sensor assembly 40b, circuit board 65b and wiring board 60b were assembled was placed within a molding die and a molten epoxy resin heated at approximately 180° C. was injected into the die and cured. During the curing of the epoxy resin, pressure enough to obtain a desired shape was applied.

Example 3

Figure 7A:
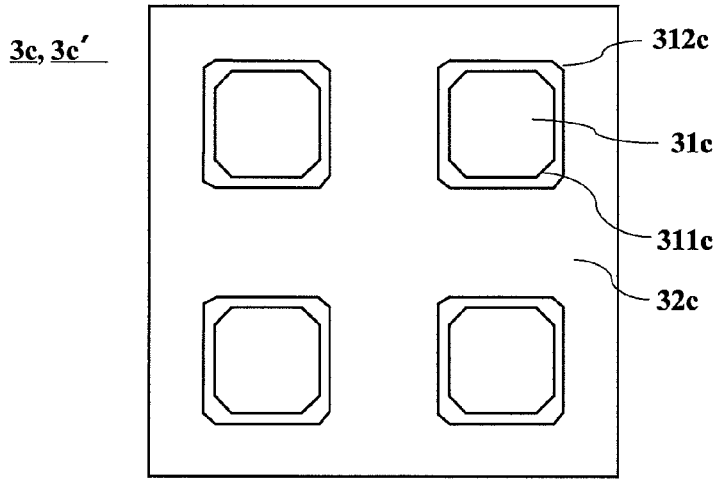
FIG. 7A is a plan view of a cap substrate for use in a semiconductor sensor device of EXAMPLE 3.
Figure 7B:
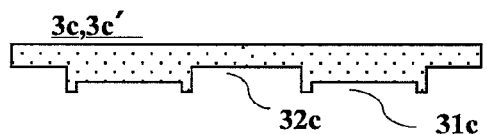
FIG. 7B is a cross-sectional view of the cap substrate.
Figure 7C:
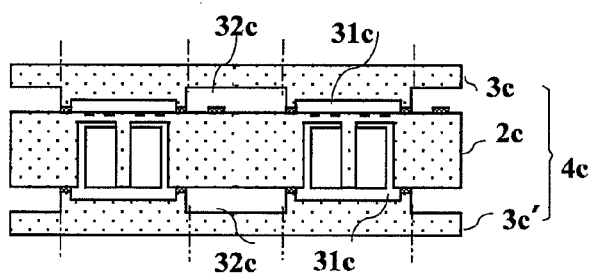
FIGS. 7C to 7F are explanatory views of a manufacturing process of the semiconductor sensor device of EXAMPLE 3.
Figure 7D:
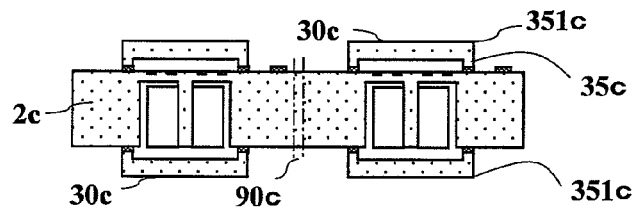
Figure 7E:
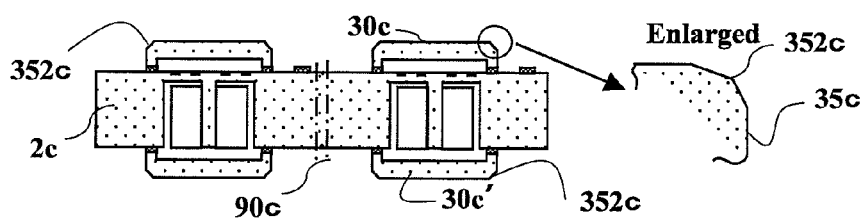
Figure 7F:
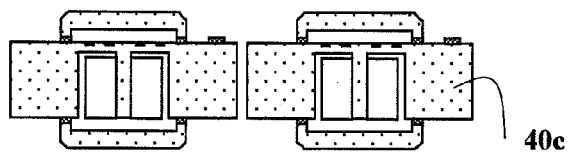

Cap chips of EXAMPLE 3 having a crystal orientation different from the cap chips of EXAMPLES 1 and 2 were thinned and divided by wet-etching, while a semiconductor sensor substrate was cut by a cutting wheel to obtain semiconductor sensor chips. With reference to FIG. 7, a description will be made about a manufacturing process of the semiconductor sensor device (acceleration sensor device) of EXAMPLE 3. FIG. 7A is a plan view of a cap substrate 3c or 3c' viewed from the side to be bonded to a semiconductor sensor substrate (acceleration sensor substrate) 2c; and FIG. 7B is a cross-sectional view of FIG. 7A. Each side surface of the cap substrates 3c, 3c' was composed of a {100} silicon crystal plane. Drive suppression grooves 31c facing weights of the semiconductor sensor substrate are octagons each surrounded by {100} planes and {111} planes and having edge portions 311c rounded off by over-etching, namely obtuse edges. Outside edge portions 312c corresponding with the edge portions 311c were also rounded off at the intersections of {100} planes and {100} planes (FIG. 7A). The cap substrates 3c, 3c' were bonded on the top surface and bottom surface of a semiconductor sensor substrate 2c, respectively, to obtain a semiconductor sensor assembled substrate (acceleration sensor assembled substrate) 4c (FIG. 7C). The semiconductor sensor assembled substrate 4c was immersed in a potassium hydroxide solution (40 wt. %) heated to 67° C. to etch the cap substrates 3c, 3c' by 300 µm. The thinned cap substrates 3c, 3c' were separated along the separating gutters 32c into cap chips 30c. Edge portions 351c of the side surfaces 35c of a cap chip were formed by intersections of a {100} plane and a {100} plane (FIG. 7D). Further wet-etching chamfered the edge portions 351c of the side surfaces 35c to form a higher-order crystal plane, thereby obtaining edge portions 352c on the side surfaces 35c composed of a {100} plane—a higher-order crystal plane—a {100} plane (FIG. 7E). After the cap substrates 3c, 3c' were thus divided into the cap chips 30c, 30c', the semiconductor sensor substrate 2c was cut off along the cutting line 90c by a 2000-grit diamond cutting wheel to divide it into semiconductor sensor chips, thereby obtaining semiconductor sensor assemblies 40c (FIG. 7F). The cutting conditions were the same as those of EXAMPLE 2. Then, the semiconductor sensor assemblies 40c were molded with a resin by the transformer molding method under the same manufacturing conditions as those of EXAMPLE 1 to form semiconductor sensor devices.

Example 4

EXAMPLE 4 used a laser to cut the semiconductor sensor substrate in a separation step (FIG. 6C) in the manufacturing process of the semiconductor sensor device of EXAMPLE 2 described with FIG. 6. The laser used was a carbon dioxide gas laser with a rated output of 800 W. The processing/feeding speed was set at 1 to 2 m/min. All steps, except for the cutting step, were carried out in the same manner as EXAMPLE 2, and the resin molding was performed by a transformer molding method under the same conditions as EXAMPLE 1.

Example 5

An airtight test was conducted on 1000 semiconductor sensor assemblies (assemblies neither attached on a board nor molded with resin) manufactured in accordance with each of EXAMPLES 1 to 4 and 1000 comparative semiconductor sensor assemblies in which the cap chips were cut by a cutting wheel. Although the number of the semiconductor sensor assemblies to be tested was 1000 from each of EXAMPLES 1 to 4 and the comparative sample, the actual number of assemblies to be tested was 2000 each since each of the semiconductor sensor assemblies included two cap chips, and therefore the population parameter was set to 2000 for the calculation of their probability of acceptance. The airtight test was conducted with a sniffer He leak detector. The results of the airtight test follow. No failure occurred in the semiconductor sensor assemblies of EXAMPLE 1 in which the cap substrates and semiconductor sensor substrate were divided into chips by wet-etching; the acceptance rate was 100%. There were eight defectives in the semiconductor sensor assemblies of EXAMPLE 2 in which the cap substrate was divided by wet-etching, but the semiconductor sensor substrate was cut off by a diamond cutting wheel; the acceptance rate was 99.6%. There was no defective in the semiconductor sensor assemblies of EXAMPLE 3 in which the cap substrates having different crystal orientation were divided by wet-etching, and the semiconductor sensor substrate was cut off by a diamond cutting wheel; the acceptance rate was 100%. No failure occurred in the semiconductor sensor assemblies of EXAMPLE 4 in which the cap substrates were divided by wet-etching, and the semiconductor sensor substrate was cut off by a laser; the acceptance rate was 100%. In the comparative semiconductor sensor assemblies, failures occurred in 618 semiconductor sensor assemblies; the acceptance rate was 69.1%. Some of the semiconductor sensor assemblies had failures in both the upper and lower cap chips, which changed the acceptance rate to 78.8% with respect to the number of semiconductor sensor assemblies (i.e., the population parameter was set to 1000). The semiconductor sensor assemblies of the present invention passed the airtight test at acceptance rates of 99.6% to 100% and were verified to be significantly improved in comparison with the comparative semiconductor sensor assemblies having passed the airtight test at the acceptance rate of 69.1%.

Examination was made for the eight defective semiconductor sensor assemblies of EXAMPLE 2. Air leakage of all the eight semiconductor sensor assemblies was to blame for cracks in the bonding portion between the cap chips and semiconductor sensor chip, and actually there were cracks in the silicon between the silicon and bonding material and in the proximity of bonding portion. There was found no crack in the silicon with a thickness of 50 µm corresponding to the drive suppression groove. Approximately 20% of the defective comparative semiconductor sensor assemblies had bonding-portion cracks, while approximately 80% of the assemblies had cap-chip cracks near the drive suppression groove. The results verified the effectiveness of thinning and dividing the cap substrate by wet-etching to prevent the cap-chip cracks near the drive suppression groove. It is conceivable that the bonding-portion cracks of the samples of EXAMPLE 2 and comparative samples occurred due to vibrations created by the diamond cutting wheel cutting the semiconductor sensor substrate or due to force, as if the cap chips were pulled off, provided by grinding coolant. The way of dividing the semiconductor sensor substrate by a diamond cutting wheel with the grinding coolant poured over the substrate is considered difficult to reduce the possibility of crack occurrences to zero.

Example 6

An evaluation was carried out about the cracks in resin parts made by a transfer molding process. In the evaluation, 1000 semiconductor sensor devices manufactured in accordance with each of EXAMPLES 1, 3 and 4 and 1000 comparative semiconductor sensor devices manufactured by cutting both the cap chips and acceleration sensor chip by a cutting wheel were used. The resin part of each sample was previously examined to detect the presence of cracks by a stereomicroscope, and only the samples having no crack were used. Each sample was subjected to temperature change from −80° C. to 80° C., which was defined as one thermal cycle. After the test of 100 thermal cycles, the samples were examined for cracks present in the resin part by the stereomicroscope. No crack was found in the samples of EXAMPLES 1, 3 and 4; the acceptance rate was 100%. There were 42 comparative semiconductor sensor device samples in which cracks have occurred; the acceptance rate was 95.8%. The semiconductor sensor devices were disassembled, and the cracks were studied and found to be started from edge portions on the side surfaces of the cap chips. This proved the effectiveness of forming the side surfaces of the cap chips with two or more planes and making the edge portions on the side surfaces obtuse.

Example 7

An evaluation was conducted about the cracks in the resin parts made by a potting process. In the evaluation, 1000 semiconductor sensor devices manufactured in accordance with EXAMPLE 2 were examined, subsequent to the thermal cycles in the same manner as those of EXAMPLE 6, by a stereomicroscope to detect the presence of cracks in the resin parts; however, no crack occurred in the samples of EXAMPLE 2; the acceptance rate was 100%. Through the consideration given to these results together with the results of EXAMPLE 6, it can be considered that the resin cracks occurring in the molding resin did not account for the resin molding methods, but for the edge shape of the side surfaces of the cap chips. This indicates that the cap chip side surfaces composed of two or more planes and the obtuse edge portions on the side surfaces are significantly effective to prevent the occurrence of the resin cracks.

Example 8

Figure 8:
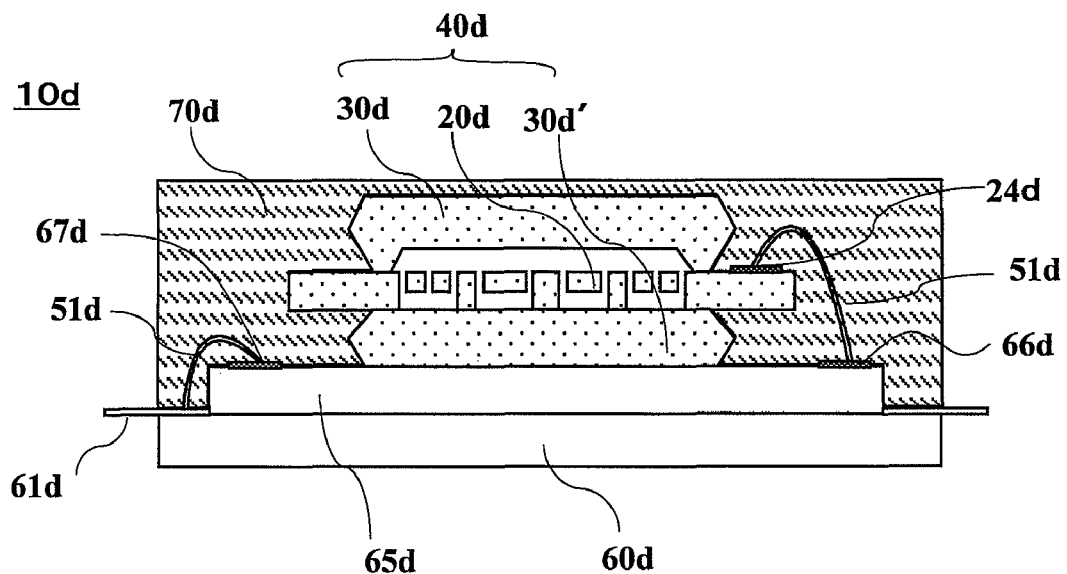
FIG. 8 is a cross-sectional view of a gyroscope sensor device of EXAMPLE 8.

FIG. 8 is a cross-sectional view of a gyroscope sensor device. The gyroscope sensor device uses a gyroscope sensor substrate as a substitute for the acceleration sensor substrate used in EXAMPLE 1. The structure of the cap substrate and the manufacturing process thereof are the same as those used in EXAMPLE 1. The gyroscope sensor device 10$d$ includes a semiconductor sensor assembly (gyroscope sensor assembly) 40$d$ composed of a gyroscope sensor chip 20$d$ having a movable part and cap chips 30$d$, 30$d'$ sealing the movable part. A circuit board 65$d$ and the semiconductor sensor assembly 40$d$ were fixed on a wiring board 60$d$ with an adhesive. A terminal 24$d$ of the semiconductor sensor assembly 40$d$ and an electrode pad 66$d$ of the circuit board 65$d$, and an electrode pad 67$d$ of the circuit board 65$d$ and an electrode pad 61$d$ of the wiring board 60$d$ were connected with electric wires 51$d$. The structure in which the semiconductor sensor assembly 40$d$, circuit board 65$d$ and wiring board 60$d$ were assembled was completely enveloped in an epoxy resin 70$d$, resulting in a gyroscope sensor device 10$d$. The gyroscope sensor chip includes a weight, a detecting part and a bonding area. An angular velocity applied to the gyroscope sensor chip causes the weight to move, and the detecting part detects the displacement of the weight as changes in electro-static capacitance. In FIG. 8, the detailed descriptions about the weight, detecting part, bonding area and so on are omitted. The gyroscope sensor substrate includes weights, detecting parts, bonding areas, and dividing gutters formed by micromachining, such as photo-lithography, etching technology, and film-forming technology. The gyroscope sensor substrate and cap substrates were bonded in vacuum to make them into a semiconductor sensor assembled substrate (gyroscope sensor assembled substrate). The semiconductor sensor assembled substrate was immersed in a tetramethylammonium solution, which is one of ammonium hydroxide-base solutions, to wet-etch it for the purpose of thinning and dividing the cap substrates. In addition, the coupling of the gyroscope sensor substrate was wet-etched to divide the gyroscope sensor substrate into chips, thereby obtaining semiconductor sensor assemblies 40$d$. Non-resin-molded semiconductor sensor assemblies 40$d$ were submitted to an airtight test. The airtight test was conducted using a sniffer He leak detector. One thousand tested samples did not show any failures and passed at rate of 100%. In addition, 1000 samples were tested to investigate cracks in resin made by a transfer molding process; however, no crack was found.

Example 9

Figure 9:
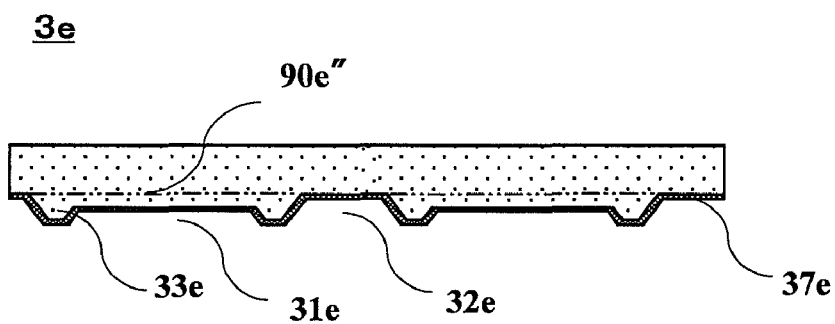
FIG. 9 shows a cross-sectional view of a cap substrate for use in EXAMPLE 9.

This EXAMPLE used cap substrates equivalent in the structure to those manufactured in EXAMPLE 1 but each having a silicon-nitride insulating protection film 37$e$ of 0.3 µm in thickness formed by CVD on the surface facing the semiconductor sensor substrate. Thus formed cap substrate 3$e$ is shown in the cross-sectional view of FIG. 9. On each bonding area 33$e$ between a drive suppression groove 31$e$ and a separating gutter 32$e$ of the cap substrate 3$e$, a gold-tin alloy film of 4 µm in thickness was formed by vacuum deposition.

Figure 10A:
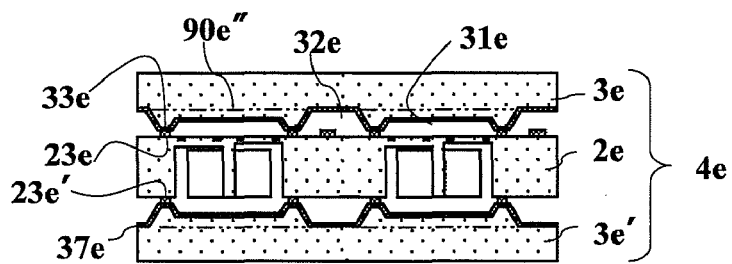
FIGS. 10A to 10G explain a manufacturing process of a semiconductor sensor device of EXAMPLE 10.
Figure 10B:
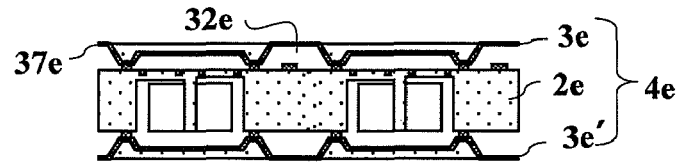
Figure 10C:
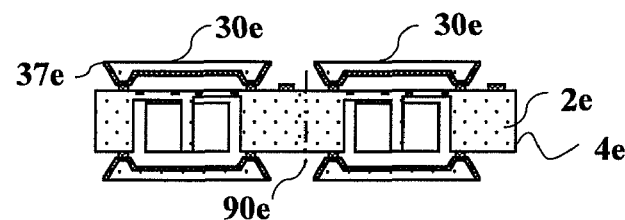
Figure 10D:
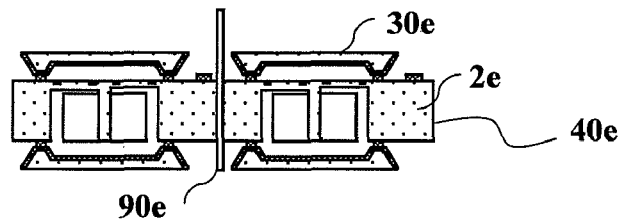
Figure 10E:
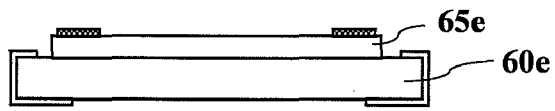
Figure 10F:
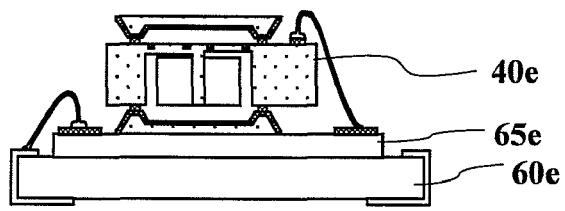
Figure 10G:
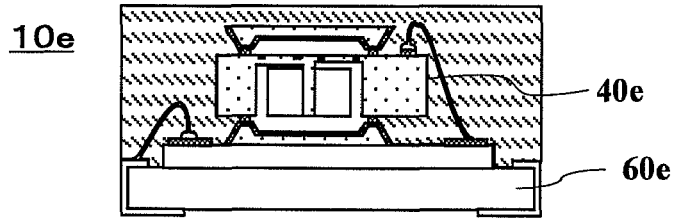

On the top and bottom surfaces of a semiconductor sensor substrate (acceleration sensor substrate) 2$e$ having the same structure as that used in EXAMPLE 2, cap substrates 3$e$, 3$e'$ were bonded, respectively, to provide a semiconductor sensor assembled substrate (acceleration sensor assembled substrate) 4$e$ shown in FIG. 10A. Specifically, gold-tin alloy films (4 µm in thickness) deposited on the bonding areas 33$e$ of the cap substrates 3$e$, 3$e'$ were pressed under pressure against gold layers of the bonding areas 23$e$, 23$e'$ of the semiconductor sensor substrate 2$e$ and heated to approximately 320° C., thereby the cap substrates 3$e$, 3$e'$ were bonded to both surfaces of the semiconductor sensor substrate 2e, respectively. The semiconductor sensor assembled substrate 4e was immersed in a potassium hydroxide solution (40 wt. %) heated to 67° C. to etch the cap substrates 3e, 3e' by 300 μm in the thickness direction up to etching lines 90e" indicated by chain double-dashed lines. The thinning of the cap substrates completely removed the silicon corresponding to the separating gutter 32e in the cap substrates and left only the insulating protection film 37e (FIG. 10B). The semiconductor sensor assembled substrate 4e was agitated from side to side and up and down for about 10 times in an etchant solution to remove the insulating protection film 37e between the cap chips 30e (FIG. 10C). The semiconductor sensor substrate 2e was cut off along the cutting line 90e by a 2000-grit diamond cutting wheel at a wheel speed of 20000 rpm to obtain semiconductor sensor assemblies (acceleration sensor assemblies) 40e (FIG. 10D). After being fixed on a circuit board 65e and a wiring board 60e and connected with electric wires, the assembly 40e was molded with resin to obtain a semiconductor sensor device (acceleration sensor device) 10e. The steps after fixing the semiconductor sensor assembly 40e on the circuit board 65e and wiring board 60e are the same as those in EXAMPLE 1 and therefore their descriptions will be omitted. The edges of the cap chips that are once etched acutely are combined with the edges of the insulating protection film that are created by mechanically removing the other parts of the insulating protection film, and the edges form an obtuse angle. The obtuse angled edges prevent molding resin cracks.

Example 10

Figure 11A:
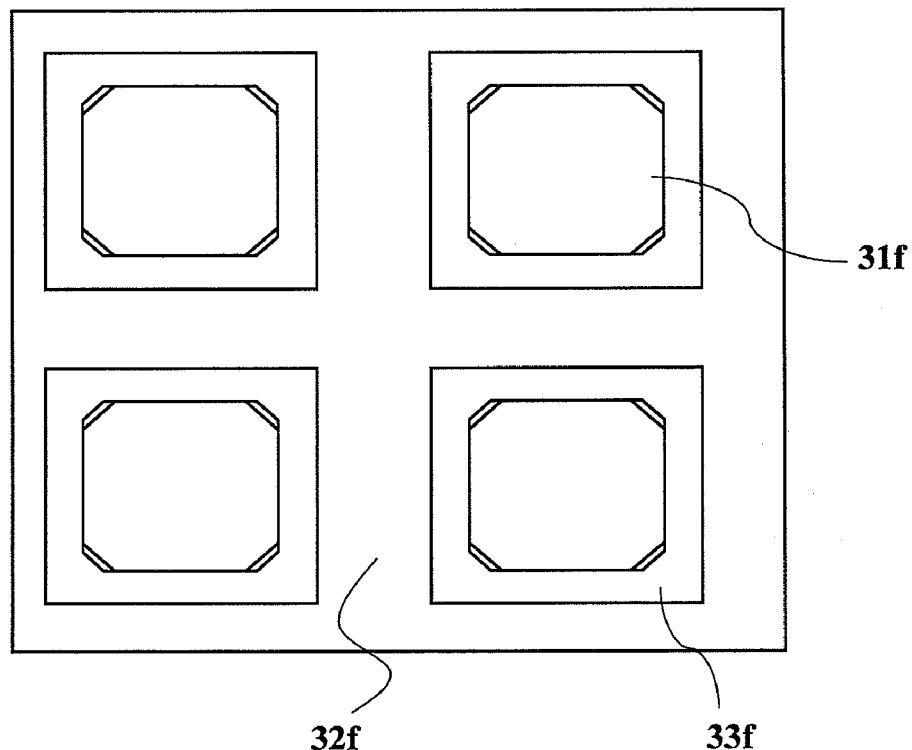
FIG. 11A is a plan view of the cap substrate.
Figure 11B:
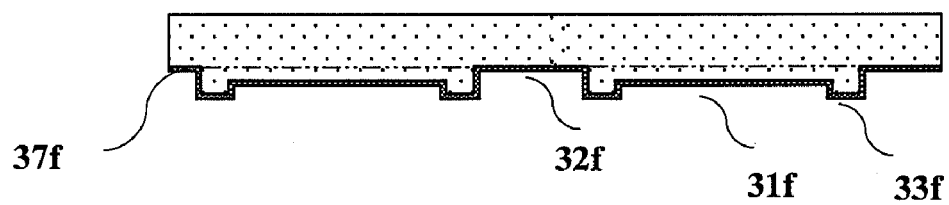
FIG. 11B is cross-sectional view of it.

This EXAMPLE used the cap substrate 3f shown in FIG. 11. FIG. 11A is a plan view of the cap substrate 3f, while FIG. 11B is a cross-sectional view of the same. The cap substrate 3f was a silicon flat plate having a thickness of 400 μm and had a surface on which drive suppression grooves 31f, depressed separating gutters 32f and projecting bonding areas 33f were formed. After a silicon dioxide film of 1.0 μm in thickness was formed by thermal oxidation on one surface of the silicon flat plate, a resist pattern for the drive suppression grooves 31f was formed and the silicon on the areas to be the drive suppression grooves 31f was removed by etching. In addition, a silicon dioxide film of 0.7 μm in thickness was formed by thermal oxidation, and a resist pattern was formed on the silicon dioxide to remove the silicon dioxide in the areas corresponding to the separating gutters 32f of the cap substrates. Next, the separating gutter 32f was wet-etched to 90 μm in depth in a potassium hydroxide solution (40 wt. %) heated to 67° C. After removal of the silicon dioxide on the entire surface of the cap substrate, the drive suppression grooves 31f had a depth of 10 μm and the separating gutters 32f were etched again by 10 μm so as to eventually have a depth of 100 μm. On the entire surface in which the drive suppression grooves 31f and separating gutters 32f were formed, a silicon dioxide film of 0.6 μm in thickness was formed by thermal oxidation as an insulating protection film 37f. A resist frame having an open space on the bonding areas was formed and a gold-tin alloy film of 4 μm in thickness was formed in the open space.

The cap substrates 3f, shown in FIG. 11, were bonded on the top and bottom surfaces of a semiconductor sensor substrate, respectively, which is the same semiconductor sensor substrate as that used in EXAMPLE 2, to form a semiconductor sensor assembled substrate. Then, the gold-tin alloy films deposited on the bonding areas of the cap substrates were heated to approximately 320° C. while being pressed under pressure against the gold layers in the bonding areas of the semiconductor sensor substrate to bond the cap substrates onto both surfaces of the semiconductor sensor substrate. Subsequently, the semiconductor sensor assembled substrate was immersed in a potassium hydroxide solution (40 wt. %) heated to 67° C. in order to completely remove the silicon left in the separating gutters after the thinning process of the cap substrates. The insulating protection film made of silicon dioxide remaining between the cap chips could be completely removed by immersing the semiconductor sensor assembled substrate in a mixture of isopropyl alcohol and water while applying ultrasonic. The use of the mixture of isopropyl alcohol and water kept the removed silicon dioxide from redepositing on the semiconductor sensor assembled substrate. The semiconductor sensor substrate was cut off by a 2000-grit diamond cutting wheel to obtain semiconductor sensor assemblies. After an assembly was fixed on a circuit board and a wiring board and connections therebetween were made with electric wires, the assembly and boards were molded with a resin to be a semiconductor sensor device.

In EXAMPLE 10 in which the side walls of the separating gutters 32f were so formed to have a {100} silicon crystal plane, the side walls were perpendicular to the cap substrate, and therefore the distance between electrodes and the side surfaces of the cap chips could be increased, thereby preventing the electric wires from abutting the side surfaces. The side surfaces of the drive suppression grooves 31f were composed of {111} crystal planes and {100} crystal planes.

Example 11

Figure 12:
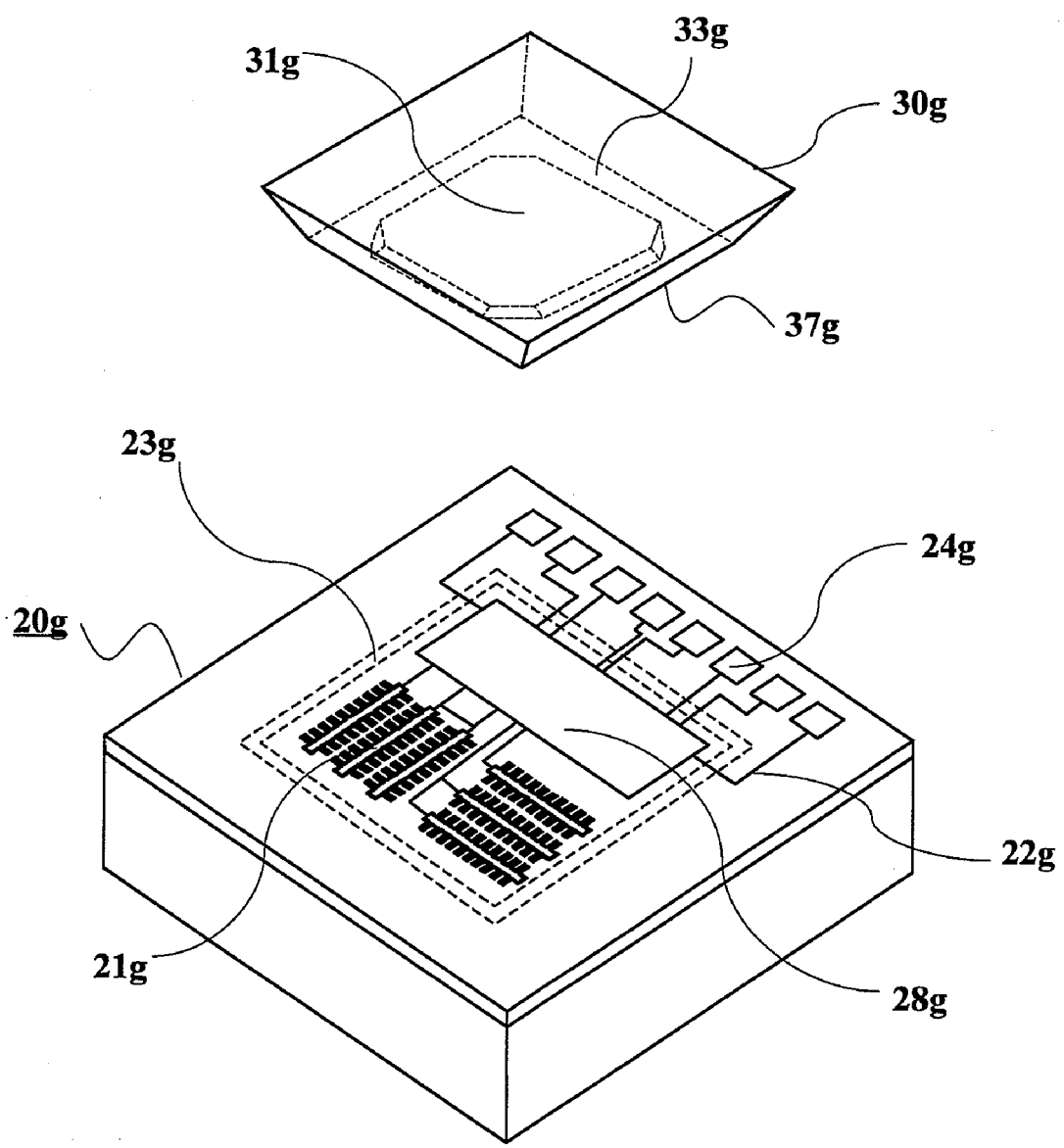
FIG. 12 shows an exploded perspective view of a semiconductor sensor device of EXAMPLE 11.

EXAMPLE 11 will be now described with reference to FIGS. 12 and 13. The semiconductor sensor device of EXAMPLE 11 is an electro-static capacitance type gyroscope sensor. The gyroscope sensor of this type has a detecting part formed on one side of a silicon substrate thereof, therefore requiring one cap chip. FIG. 12 is an exploded perspective view of the gyroscope sensor, while FIGS. 13A to 13F are explanatory views of a manufacturing process of a semiconductor sensor device applied to the gyroscope sensor.

As shown in FIG. 12, a semiconductor sensor chip (gyroscope sensor chip) 20g includes an electrostatic capacitive detecting part 21g, a circuit element 28g, electric wires 22g, electrode pads 24g, and a bonding area 23g. In manufacture of the semiconductor sensor chip 20g, an SOI wafer was used in which a silicon dioxide layer of several micrometers in thickness and a silicon layer of several tens of micrometers in thickness were laminated on a silicon plate of approximately 500 μm in thickness. On the side of the silicon layer of the SOI wafer, the circuit element 28g for amplifying signals, electrostatic capacitive detecting part 21g, bonding area 23g and electrode pads 24g were formed by means of a semiconductor processing technology, photo-lithography and film-forming technology. A cap chip 30g has the same structure as that described in EXAMPLE 1, but includes a silicon-dioxide insulating protection film 37g of 1.0 μm in thickness formed by thermal oxidation on the surface facing the semiconductor sensor substrate. On the surface of the cap chip 30g facing the semiconductor sensor chip 20g, there are a drive suppression groove 31g in the shape of a quadrilateral base and a bonding area 33g in the shape of a bank around the drive suppression groove 31g. A gold-tin alloy film of 4 μm in thickness is formed on the bonding area 33g by vacuum deposition.

Figure 13A:
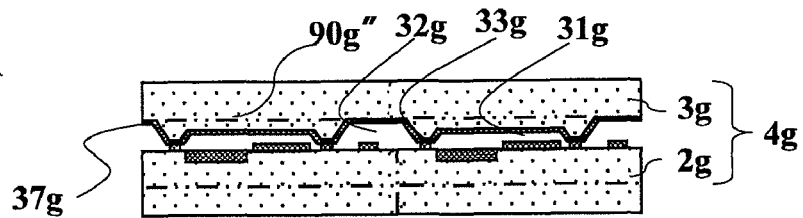
FIGS. 13A to 13F are explanatory views of a manufacturing process of the semiconductor sensor device of EXAMPLE 11.
Figure 13B:
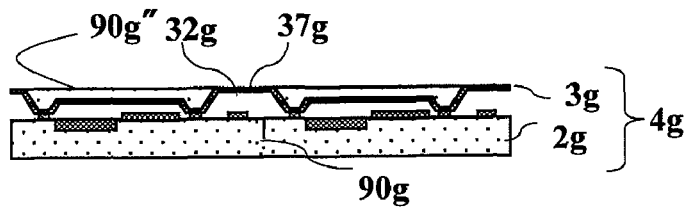
Figure 13C:
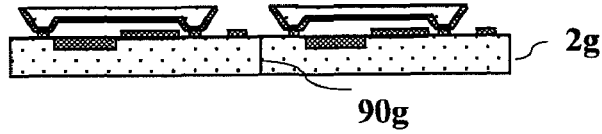
Figure 13D:
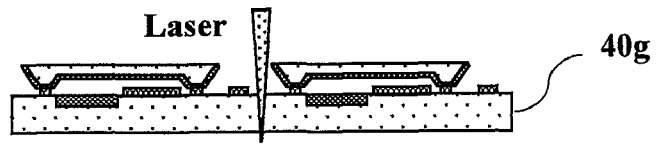

The process of manufacturing the semiconductor sensor device (gyroscope sensor device) 10g of EXAMPLE 11 will be described with reference to FIGS. 13A to 13F. A cap substrate 3g is bonded on a surface, in which a circuit element 28g and an electrostatic capacitive detecting part 21g are formed, of a semiconductor sensor substrate (gyroscope sensor substrate) 2g to provide a semiconductor sensor assembled substrate (gyroscope sensor assembled substrate) 4g (FIG. 13A). The semiconductor sensor assembled substrate 4g was immersed in a tetramethylammonium solution (25 wt. %) heated to 70° C. to etch and thin the cap substrate 3g and semiconductor sensor substrate 2g up to etching lines 90g" indicated by chain double-dashed lines. The part removed by etching has a thickness of 300 μm. This thinning of the cap substrate completely removes the silicon corresponding to the separating gutter 32g, but leaves only the insulating protection film 37g (FIG. 13B). The insulating protection film 37g between the cap chips can be mostly removed by agitating the semiconductor sensor assembled substrate 4g in an etchant solution and in cleaning liquid, and the residue was completely removed by brushing the insulating protection film 37g several times (FIG. 13C). The semiconductor sensor substrate 2g was cut off along the cutting line 90g by laser irradiation. The laser used herein was a carbon dioxide gas laser having a rated power of 800 W. The cutting process was performed at a feeding speed of 1 to 2 m/min, thereby obtaining semiconductor sensor assemblies (gyroscope sensor assemblies) 40g (FIG. 13D).

Figure 13E:
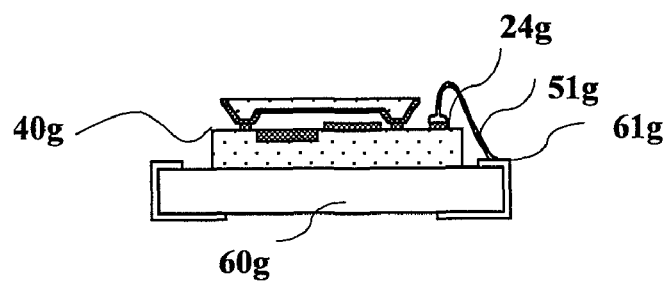
Figure 13F:
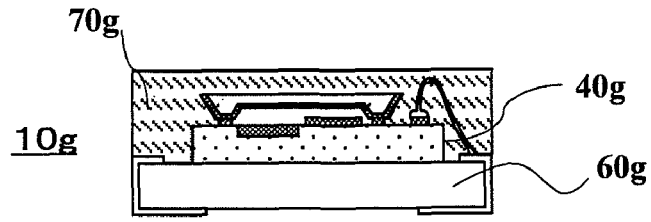
Figure 14A:
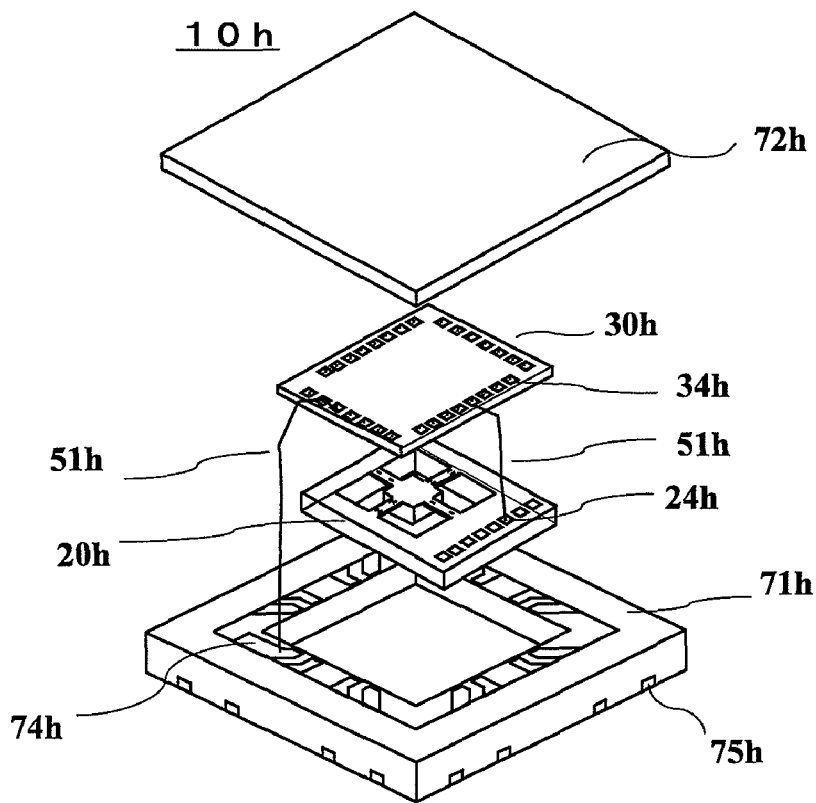
FIG. 14A is an exploded perspective view of the acceleration sensor.
Figure 14B:
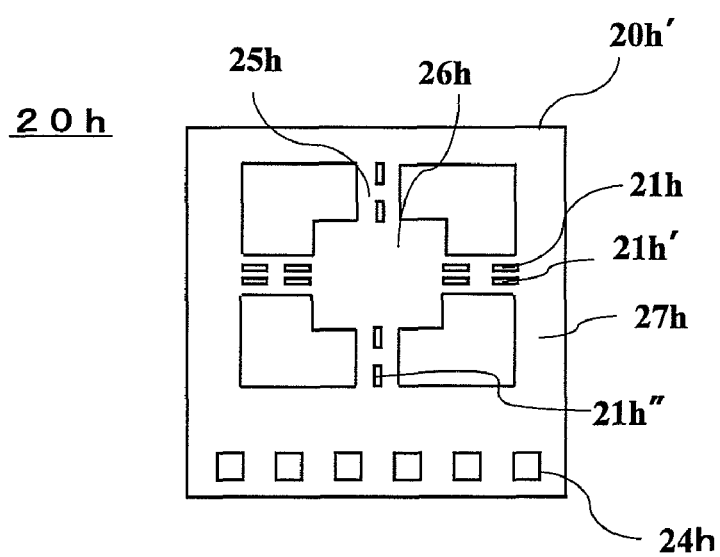
FIG. 14B is a plan view of an acceleration sensor chip used in it.
Figure 15A:
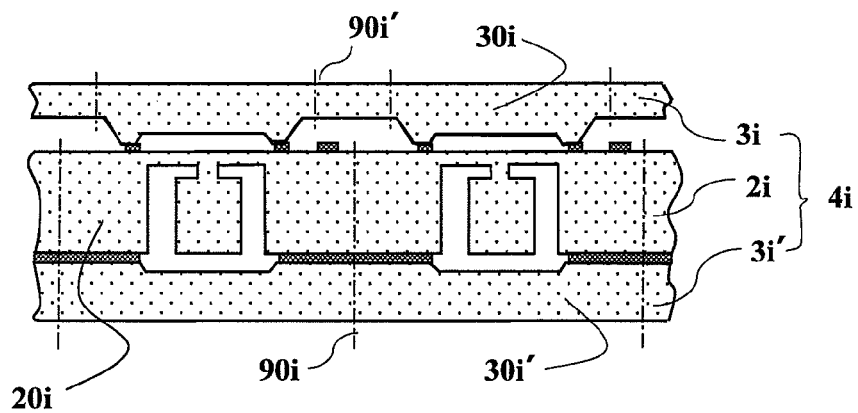
FIG. 15A is a cross-sectional view of a semiconductor sensor assembled substrate described in a document.
Figure 15B:
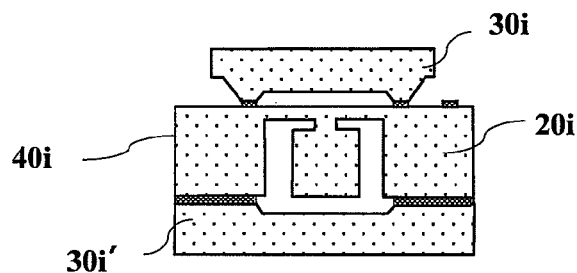
FIG. 15B is a cross-sectional view of a semiconductor sensor assembly made of the substrate.
Figure 15C:
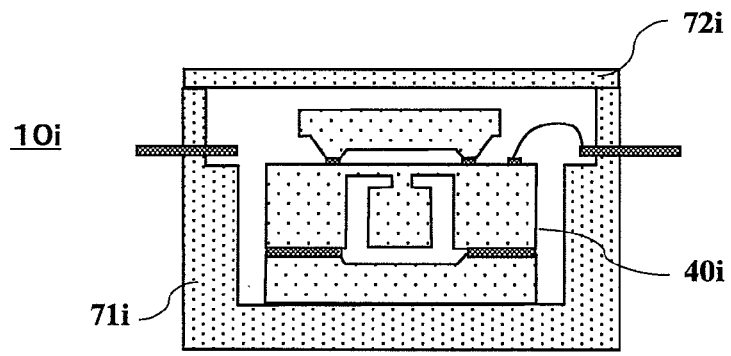
FIG. 15C is a cross-sectional view of a semiconductor sensor device using the assembly.
Figure 15D:
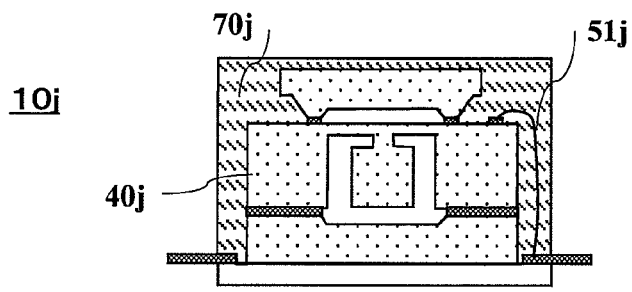
FIG. 15D is a cross-sectional view of another semiconductor sensor device having the assembly molded with a resin.
Figure 16A:
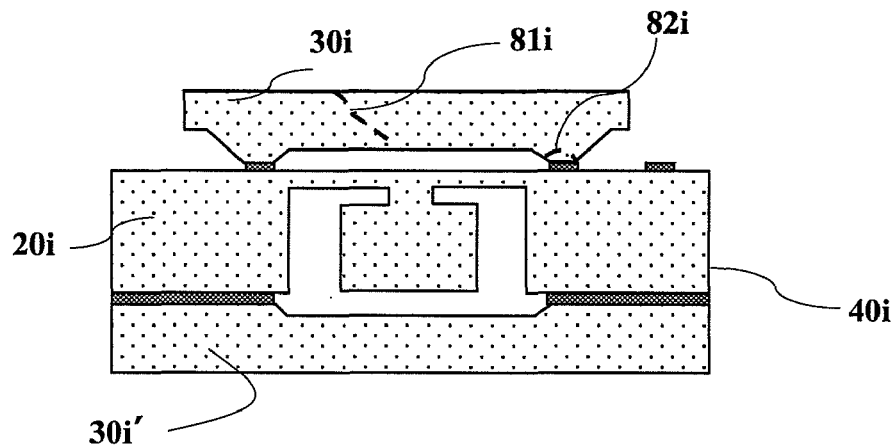
FIGS. 16A and 16B are explanatory views of conventional semiconductor sensor devices with cracks.
Figure 16B:
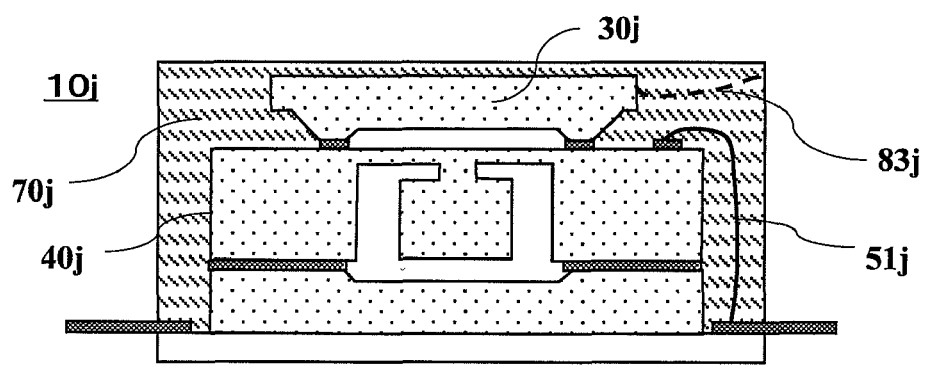
Figure 17:
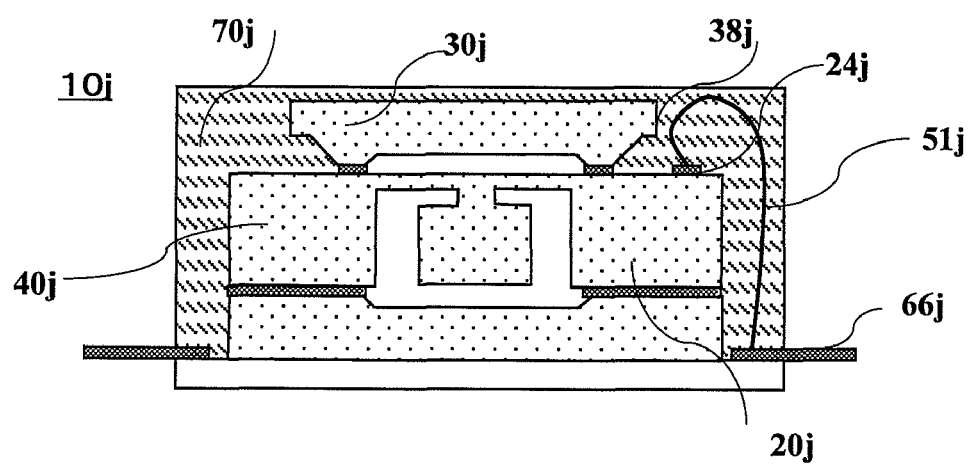
FIG. 17 explains a conventional semiconductor sensor device in which an electric wire might contact a semiconductor sensor chip.

A semiconductor sensor assembly 40g was adhered on a wiring board 60g of 200 μm in thickness with an epoxy-base resin, and an electrode pad 24g of the semiconductor sensor assembly 40g and an electrode pad 61g of the wiring board 60g were connected with a bare gold electric wire 51g having a diameter of 25 μm (FIG. 13E). The structure in which the semiconductor sensor assembly 40g and wiring board 60g were assembled was molded with an epoxy resin 70g by a transformer molding method to obtain a semiconductor sensor device 10g (FIG. 13F).

Example 12

An evaluation was made on the presence of noise and short circuits with semiconductor sensor devices each using a silicon cap with one of the insulating protection films 37e, 37f and 37g of EXAMPLES 9 to 11, respectively, and comparative semiconductor sensor devices each using silicon caps without any of the insulating protection film. There were eight defectives out of 2000 comparative semiconductor sensor devices; the defect rate was 0.4%. No failure occurred in each of the 2000 semiconductor sensor devices of EXAMPLES 9 to 11 with an insulating protection film formed on a surface of the cap chips; the defect rate was 0%. The insulating protection film formed on side surfaces of the cap chip can avert failures such as noise and short circuits.

INDUSTRIAL APPLICABILITY

The semiconductor sensor device of the present invention manufactured by the MEMS technology has a cap chip whose circumference side surfaces are wet-etched, which prevents cracks in the cap chip and molding resin during the cutting operation and ensures airtightness between the semiconductor sensor chip and cap chip. In addition, the cap chip whose side surfaces are coated with an insulating protection film ensures its insulating property. This makes the semiconductor sensor device of the present invention, which is used to detect and measure physical quantity, such as acceleration, angular velocity and pressure, highly reliable with less failure occurrence.

The invention claimed is:
1. A semiconductor sensor, comprising:
a semiconductor sensor assembly comprising:
a semiconductor sensor chip having a movable part and a bonding area surrounding the movable part, and
a cap chip placed on at least one of a top surface and a bottom surface of the semiconductor sensor chip and having a quadrilateral base and a bonding area which is formed in a bank along a periphery of the base and is bonded to the bonding area of the semiconductor sensor chip to air-tighten the movable part of the semiconductor sensor chip;
a base plate on which the semiconductor sensor assembly is fixed and held;
electric wires connecting the semiconductor sensor chip to the base plate; and
a resin molding the semiconductor sensor assembly on the base plate,
wherein a circumference side surface of the cap chip is wet-etched, and
wherein the circumference side surface is coated with an insulating protection film on a wet-etched surface of the side surface.
2. A semiconductor sensor device as set forth in claim 1, wherein the insulating protection film is proof against alkali.
3. A semiconductor sensor device as set forth in claim 1, wherein the insulating protection film is 0.1 μm or more in thick.
4. A semiconductor sensor device, comprising:
a semiconductor sensor assembly comprising:
a semiconductor sensor chip having a movable part and a bonding area surrounding the movable part, and
a cap chip placed on at least one of a top surface and a bottom surface of the semiconductor sensor chip and having a quadrilateral base and a bonding area which is formed in a bank along a periphery of the base and is bonded to the bonding area of the semiconductor sensor chip to air-tighten the movable part of the semiconductor sensor chip;
a base plate on which the semiconductor sensor assembly is fixed and held;
electric wires connecting the semiconductor sensor chip to the base plate; and
a resin molding the semiconductor sensor assembly on the base plate,
wherein a circumference side surface of the cap chip is wet-etched, and
wherein other surfaces of the semiconductor sensor chip than a circumference side surface of the semiconductor sensor chip are coated with an alkali-proof film.
5. A method for manufacturing a semiconductor sensor device comprising:
providing a semiconductor sensor substrate comprising a plurality of semiconductor sensor chips each having a movable part and a bonding area surrounding the movable part, and a cap substrate comprising a plurality of cap chips each having a quadrilateral base and a bonding area which is formed in a bank-like shape along a periphery of the base;
placing the cap substrate on at least one of a top surface and a bottom surface of the semiconductor sensor substrate to bond the bonding area of each of the plurality of cap chips to the bonding area of each of the plurality of semiconductor sensor chips to form a semiconductor sensor assembled substrate in which the movable part of each of the plurality of semiconductor sensor chips is air-tightened with each of the plurality of cap chips;

immersing the semiconductor sensor assembled substrate in a wet-etching solution to thin the cap substrate and to divide the cap substrate into the plurality of cap chips by wet-etching the cap substrate in the thickness direction of the cap substrate;

dividing the semiconductor sensor substrate into the plurality of semiconductor sensor chips, during or after the time the cap substrate is thinned, to form a semiconductor sensor assembly in which a cap chip is fixed to a semiconductor sensor chip; and bonding and fixing the semiconductor sensor assembly onto a base plate, connecting the semiconductor sensor chip to the base plate with electric wires and molding the semiconductor sensor assembly on the base plate with a resin.

6. A method for manufacturing a semiconductor sensor device as set forth in claim 5, wherein a circumference of each of the plurality of semiconductor sensor chips of the semiconductor sensor substrate is wet-etched from a top and a bottom during the time the semiconductor sensor assembled substrate is immersed in the wet-etching solution to divide the semiconductor sensor substrate into the plurality of semiconductor sensor chips to form the semiconductor sensor assembly in which the cap chip is fixed to the semiconductor sensor chip.

7. A method for manufacturing a semiconductor sensor device as set forth in claim 5, wherein the semiconductor sensor substrate is mechanically cut or cut by laser, after the semiconductor sensor assembled substrate is immersed in the wet-etching solution to wet-etch and to thin the cap substrate in the thickness of the cap substrate, to divide into the plurality of semiconductor sensor chips to form the semiconductor sensor assembly in which the cap chip is fixed to the semiconductor sensor chip.

8. A method for manufacturing a semiconductor sensor device as set forth in claim 5, wherein the cap substrate has the plurality of cap chips having insulating protection films on surfaces other than the bonding areas of the cap chips.

* * * * *